United States Patent
Hoshi

(10) Patent No.: US 12,230,704 B2
(45) Date of Patent: Feb. 18, 2025

(54) SEMICONDUCTOR DEVICE

(71) Applicant: FUJI ELECTRIC CO., LTD., Kawasaki (JP)

(72) Inventor: Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 8 days.

(21) Appl. No.: 16/984,123

(22) Filed: Aug. 3, 2020

(65) Prior Publication Data
US 2021/0074845 A1 Mar. 11, 2021

(30) Foreign Application Priority Data
Sep. 6, 2019 (JP) .................................. 2019-162542

(51) Int. Cl.
*H01L 29/78* (2006.01)
*H01L 21/02* (2006.01)
(Continued)

(52) U.S. Cl.
CPC .... *H01L 29/7811* (2013.01); *H01L 21/02529* (2013.01); *H01L 21/0465* (2013.01);
(Continued)

(58) Field of Classification Search
CPC ............. H01L 29/1608; H01L 29/7811; H01L 29/7813; H01L 29/781; H01L 29/0623; H01L 29/0619; H01L 29/0696
See application file for complete search history.

(56) References Cited

U.S. PATENT DOCUMENTS 4,593,302 A    6/1986  Lidow et al.
2004/0253807 A1 *  12/2004  Thei .................. H01L 21/76849
                                                257/E21.585
(Continued)

FOREIGN PATENT DOCUMENTS

JP    H0370371 B2    11/1991
JP    2014175314 A     9/2014
(Continued)

OTHER PUBLICATIONS

Japanese Office Action dated Aug. 29, 2023, in the counterpart Japanese Patent Application 2019-162542.

*Primary Examiner* — Samuel A Gebremariam
*Assistant Examiner* — Jonas T Beardsley
(74) *Attorney, Agent, or Firm* — Rabin & Berdo, P.C.

(57) ABSTRACT

A semiconductor device has an active region through which a main current flows, a gate ring region surrounding a periphery of the active region, a source ring region surrounding a periphery of the gate ring region, and a termination region surrounding a periphery of the source ring region. The semiconductor device has a semiconductor substrate of a first conductivity type, a first semiconductor layer of the first conductivity type, a second semiconductor layer of a second conductivity type, and further, in the active region, first semiconductor regions of the first conductivity type, a gate insulating film, first gate electrodes, an interlayer insulating film, a first first-electrode, a first plating film, and a second electrode. The semiconductor device has, in the source ring region, a second first-electrode provided at a surface of the second semiconductor layer, and a second plating film provided on the second first-electrode.

11 Claims, 20 Drawing Sheets

(51) Int. Cl.
    *H01L 21/04*     (2006.01)
    *H01L 23/49*     (2006.01)
    *H01L 29/06*     (2006.01)
    *H01L 29/10*     (2006.01)
    *H01L 29/16*     (2006.01)
    *H01L 29/40*     (2006.01)
    *H01L 29/66*     (2006.01)

(52) U.S. Cl.
    CPC ........ *H01L 21/0475* (2013.01); *H01L 21/049* (2013.01); *H01L 23/49* (2013.01); *H01L 29/0623* (2013.01); *H01L 29/1095* (2013.01); *H01L 29/1608* (2013.01); *H01L 29/402* (2013.01); *H01L 29/66068* (2013.01); *H01L 29/7813* (2013.01)

(56) References Cited

U.S. PATENT DOCUMENTS

| | | | |
|---|---|---|---|
| 2006/0097267 A1* | 5/2006 | Kumar | H01L 29/7813 257/77 |
| 2008/0265314 A1* | 10/2008 | Kobayashi | H01L 29/41766 257/E29.136 |
| 2014/0367770 A1* | 12/2014 | Aoki | H01L 29/7809 257/329 |
| 2015/0380401 A1 | 12/2015 | Ishii et al. | |
| 2016/0020289 A1* | 1/2016 | Nakano | H01L 29/1608 257/77 |
| 2018/0114829 A1* | 4/2018 | Nagaoka | H01L 29/063 |
| 2019/0097004 A1* | 3/2019 | Ina | H01L 29/407 |
| 2019/0140093 A1* | 5/2019 | Okumura | H01L 29/1608 |
| 2019/0244879 A1 | 8/2019 | Ohoka et al. | |
| 2019/0333986 A1* | 10/2019 | Fukui | H01L 29/7811 |
| 2019/0341308 A1* | 11/2019 | Urakami | H01L 29/7397 |
| 2020/0020797 A1 | 1/2020 | Suzuki et al. | |
| 2020/0161480 A1* | 5/2020 | Okamoto | H01L 29/872 |

FOREIGN PATENT DOCUMENTS

| | | | |
|---|---|---|---|
| JP | 5962863 B2 | | 8/2016 |
| JP | P 2017-216568 | * | 11/2017 |
| JP | 2018117016 A | | 7/2018 |
| JP | 2019140169 A | | 8/2019 |
| WO | 2019069580 A1 | | 4/2019 |

* cited by examiner

SEMICONDUCTOR DEVICE

CROSS REFERENCE TO RELATED APPLICATIONS

This application is based upon and claims the benefit of priority of the prior Japanese Patent Application No. 2019-162542, filed on Sep. 6, 2019, the entire contents of which are incorporated herein by reference.

BACKGROUND OF THE INVENTION

1. Field of the Invention

Embodiments of the invention relate to a semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

Meanwhile, there is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor material even at high temperatures. Further, silicon carbide has a critical field strength that is at least ten times greater than the critical field strength of silicon and therefore, is expected to be a semiconductor material capable of sufficiently reducing ON resistance. Such characteristics of silicon carbide are shared by other wide bandgap semiconductor materials such as gallium nitride (GaN) that have a bandgap wider than that of silicon (hereinafter, wide bandgap semiconductor material). Therefore, use of a wide bandgap semiconductor material enables higher voltages for semiconductor devices.

A structure of a conventional silicon carbide semiconductor device will be described taking a vertical MOSFET as an example. FIG. 22 is a top view of the structure of the conventional silicon carbide semiconductor device. As depicted in FIG. 22, a semiconductor chip (vertical MOSFET) 1600 includes, at a part at an outer periphery of an active region 1150 through which main current flows, an edge termination region 1168 that sustains breakdown voltage and surrounds a periphery of the active region 1150. In the active region 1150, a gate electrode pad 1100 that is electrically connected to gate electrodes, and a source electrode pad 1104 that is electrically connected to a source electrode are provided. Further, a gate ring region 1160 formed by wiring for connecting the gate electrodes and the gate electrode pad 1100 is provided between the active region 1150 and the edge termination region 1168.

To further increase reliability of a silicon carbide semiconductor device, a semiconductor device has been proposed in which high-function regions 1400 such as a current sensing part, a temperature sensing part (not depicted), and an over-voltage protecting part (not depicted) are disposed on a single semiconductor substrate having the semiconductor chip 1600. In a case of a high-functioning structure, to stably form the high-function regions 1400, in the active region 1150, a region in which only the high-function regions 1400 are disposed is provided separate from unit cells of a main semiconductor element and adjacent to the edge termination region 1168. The active region 1150 is a region through which main current passes when the main semiconductor element is ON. The edge termination region 1168 is a region for mitigating electric field at a front side of the semiconductor substrate and for sustaining breakdown voltage (withstand voltage). Breakdown voltage is a voltage limit at which no errant operation or destruction of an element occurs.

In the current sensing part, a current sensing part pad 1202 for current detection and an active region 1230 of the current sensing part, having a structure similar to that of the active region 1150 are provided. The temperature sensing part has a function of using diode temperature characteristics to detect a temperature of the semiconductor chip.

FIG. 23 is a cross-sectional view of the structure of the conventional silicon carbide semiconductor device along cutting line A-A depicted in FIG. 22. FIG. 23 is a cross-sectional view of a structure of a conventional trench-type silicon carbide semiconductor device. In a trench-type MOSFET (the semiconductor chip 1600), at a front surface of an $n^+$-type silicon carbide substrate 1001, an n-type silicon carbide epitaxial layer 1002 is deposited. In the active region 1150, at a surface of a first side of the n-type silicon carbide epitaxial layer 1002, opposite a second side thereof that faces the $n^+$-type silicon carbide substrate 1001, n-type high-concentration regions 1005 are provided. Further, in the n-type high-concentration regions 1005, second $p^+$-type base regions 1004 are selectively provided so as to underlie entire areas of bottoms of trenches 1016. At surface layers of first sides of the n-type high-concentration regions 1005, opposite second sides thereof that face the $n^+$-type silicon carbide substrate 1001, first $p^+$-type base regions 1003 are selectively provided.

Further, in the active region 1150 of the conventional trench-type MOSFET (the semiconductor chip 1600), a p-type base layer 1006, $n^+$-type source regions 1007, $p^{++}$-type contact regions 1008, a gate insulating film 1009, gate electrodes 1010, an interlayer insulating film 1011, a source electrode 1012, a back electrode 1013, the trenches 1016, the source electrode pad (not depicted), and a drain electrode pad (not depicted) are further provided.

The source electrode 1012 is a multilayered film in which NiSi electrodes 1015, first TiN films 1020, first Ti films 1021, a second TiN film 1022, a second Ti film 1033, and an Al alloy film 1029 are sequentially stacked on the $n^+$-type source regions 1007 and the $p^{++}$-type contact regions 1008. Further, at a top of the source electrode 1012, plating films

1014, solder 1024, an external electrode pin 1026, a first protective film 1023, and a second protective film 1025 are provided.

Further, in the gate ring region 1160 of the conventional trench-type MOSFET (the semiconductor chip 1600), the first p$^+$-type base regions 1003, the p-type base layer 1006, and the p$^{++}$-type contact regions 1008 are provided. On the p$^{++}$-type contact regions 1008, an insulating film 1530, the gate electrodes 1010, the interlayer insulating film 1011, a gate wiring electrode 1017, and the first protective film 1023 are provided.

Further, at a front surface in the edge termination region 1168 of the conventional trench-type MOSFET (the semiconductor chip 1600), entire areas of the p-type base layer 1006 and the p$^{++}$-type contact regions 1008 are removed, thereby forming a recess (curved away from the n$^+$-type silicon carbide substrate 1001) where the edge termination region 1168 is lower than the active region 1150 and the n-type silicon carbide epitaxial layer 1002 is exposed at a bottom of the recess.

Further, in the edge termination region 1168, a JTE structure is provided in which plural p$^+$-type regions (herein, 2 regions including a first JTE region 1163 and a second JTE region 1165) are disposed adjacently to each other. Further, an n$^+$-type semiconductor region 1167 that functions as a channel stopper is provided outside (closer to a chip end than is) the JTE structure.

The first JTE region 1163 and the second JTE region 1165 are each selectively provided at parts of the n-type silicon carbide epitaxial layer 1002 exposed at the bottom of the recess. When high voltage is applied, high breakdown voltage in a horizontal direction other than that in the active region 1150 is secured by pn junctions between the first JTE region 1163, the second JTE region 1165, and the n-type silicon carbide epitaxial layer 1002.

Further, a commonly known semiconductor device is capable of improving flatness of a surface metal layer without sacrificing breakdown voltage characteristics, the semiconductor device including an n$^-$-type epitaxial layer having a cell region and an outer peripheral region disposed at a periphery of the cell region and a surface insulating film that is disposed straddling the cell region and the outer peripheral region and formed so as to be thinner in the cell region than a part in the outer peripheral region (for example, refer to Japanese Laid-Open Patent Publication No. 2014-175314).

Further, a commonly known semiconductor device is capable of suppressing destruction at an edge termination region, the semiconductor device including an extraction electrode that is provided on a front surface of a semiconductor substrate, at a border between high-function regions and the edge termination region, and has a function of extracting hole current that flows into the high-function regions from the edge termination region when a main semiconductor element is OFF (for example, refer to International Publication No. WO2019/069580).

SUMMARY OF THE INVENTION

According to an embodiment of the invention, a semiconductor device has an active region through which a main current flows, a gate ring region surrounding a periphery of the active region, a ring region surrounding a periphery of the gate ring region, and a termination region surrounding a periphery of the ring region. The semiconductor device includes: a semiconductor substrate of a first conductivity type, the semiconductor substrate having a front surface and a back surface opposite to each other; a first semiconductor layer of the first conductivity type, provided at the front surface of the semiconductor substrate and having an impurity concentration lower than an impurity concentration of the semiconductor substrate, the first semiconductor layer having a first side and a second side opposite to each other, the second side facing the semiconductor substrate; a second semiconductor layer of a second conductivity type, provided at a surface of the first semiconductor layer at the first side thereof, the second semiconductor layer having a first side and a second side opposite to each other, the second side of the second semiconductor layer facing the semiconductor substrate; in the active region, a plurality of first semiconductor regions of the first conductivity type, selectively provided in a surface layer of the second semiconductor layer at the first side thereof, a gate insulating film having a first side and a second side opposite to each other, a surface thereof at the second side being in contact with the second semiconductor layer, a plurality of first gate electrodes provided at a surface of the gate insulating film at the first side thereof, an interlayer insulating film provided on the plurality of first gate electrodes, a first first-electrode provided at a surface of the second semiconductor layer and surfaces of the plurality of first semiconductor regions, and a first plating film selectively provided on the first first-electrode; in the gate ring region, a first insulating film having a first side and a second side opposite to each other, a surface thereof at the second side being in contact with the second semiconductor layer, and a second gate electrode provided at a surface of the first insulating film at the first side thereof, and a gate wiring electrode provided on the second gate electrode; in the ring region, a second first-electrode provided at the surface of the second semiconductor layer, and a second plating film provided on the second first-electrode; and a second electrode provided at the back surface of the semiconductor substrate.

In the embodiment, the semiconductor device further includes, in the active region, a plurality of trenches each penetrating one of the plurality of first semiconductor regions, penetrating the second semiconductor layer, and reaching the first semiconductor layer. The plurality of first gate electrodes are respectively provided in the plurality of trenches via the gate insulating film.

In the embodiment, the gate ring region has a dividing region that is free of the gate wiring electrode, and the semiconductor device further includes, in the dividing region, a short-circuit electrode that electrically connects the first first-electrode and the second first-electrode.

In the embodiment, the dividing region is free of the second gate electrode.

In the embodiment, the semiconductor device further includes a second insulating film partially provided on the gate wiring electrode; and a short-circuit electrode provided on the second insulating film, and electrically connecting the first first-electrode and the second first-electrode.

In the embodiment, the semiconductor device further includes: a first solder provided on the first plating film, a first electrode pin provided on the first solder, a second solder provided on the second plating film, a second electrode pin provided on the second solder, and a short-circuit electrode electrically connecting the first electrode pin and the second electrode pin.

In the embodiment, a mathematical area of a part where the second first-electrode is in contact with the surface of the second semiconductor layer is at least two times greater than a mathematical area of a part where the first first-electrode is in contact with the surface of the second semiconductor layer and the surfaces of the plurality of first semiconductor regions.

In the embodiment, the active region has a rectangular shape, and the second first-electrode has a width that is greater at a corner part of the ring region surrounding the periphery of the gate ring region and the active region, than at other parts of the ring region.

Objects, features, and advantages of the present invention are specifically set forth in or will become apparent from the following detailed description of the invention when read in conjunction with the accompanying drawings.

DETAILED DESCRIPTION OF THE INVENTION

Figure 23:
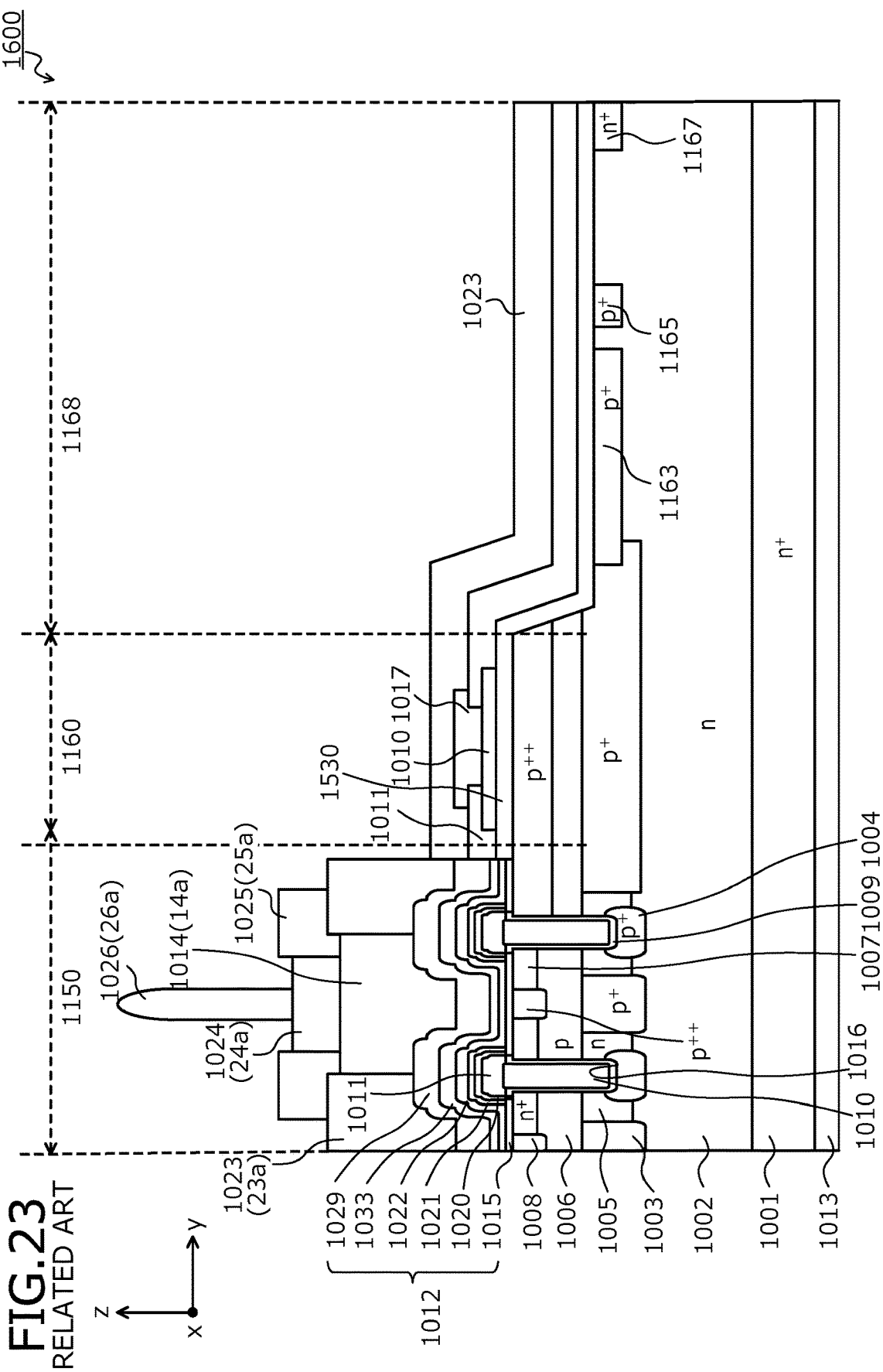
FIG. 23 is a cross-sectional view of the structure of the conventional silicon carbide semiconductor device along cutting line A-A depicted in FIG. 22.

First, problems associated with the conventional techniques will be discussed. In the conventional semiconductor device described above (refer to FIG. 23), a wide bandgap semiconductor is used as a semiconductor material and therefore, compared to a case in which silicon is used as a semiconductor material, a width of the edge termination region 1168 may be about ⅕ times to ½ times narrower. Additionally, a thickness of the edge termination region 1168 may be at least ½ times thinner. Therefore, by reducing the width of the edge termination region 1168 and reducing the thickness of the edge termination region 1168, reduction of the ON resistance (RonA) of the MOSFET is possible.

Nonetheless, by reducing the width of the edge termination region 1168 and reducing the thickness of the edge termination region 1168, capacitance (pn junction capacitance) of a depletion layer decreases, the depletion layer spreading in a direction (horizontal direction) parallel to the front surface of the semiconductor substrate, toward an end of the chip from the pn junction between the p-type base layer 1006 and the n-type silicon carbide epitaxial layer 1002, when the MOSFET is OFF. Therefore, during switching of the MOSFET (especially when the MOSFET is OFF), for example, when voltage between a drain and a source varies (hereinafter, dv/dt surge) for a brief time due to noise such as surges, displacement current flowing in the pn junction capacitance increases remarkably. In particular, a current value of the displacement current that flows during discharge of the pn junction capacitance is a current value when silicon is used as the semiconductor material, proportional to an extent to which the volume that the edge termination region 1168 is reduced.

Displacement current (hereinafter, simply, hole current) that is due to holes when the MOSFET is OFF flows from the edge termination region 1168 toward the active region 1150 and is pulled out from the $p^{++}$-type contact regions 1008 of the active region 1150 to the source electrode 1012. The gate ring region 1160 is free of the $n^+$-type source regions 1007, etc. and therefore, a mathematical area of the $p^{++}$-type contact regions 1008 is greater than that of other parts of the active region 1150. Therefore, in particular, while the hole current concentrates at the gate ring region 1160, the insulating film 1530 is disposed between the gate electrodes 1010 and the $p^{++}$-type contact regions 1008 in the gate ring region 1160, whereby the hole current is not extracted. Thus, the hole current concentrates in the MOSFET at an end of the active region 1150, whereby an element may be destroyed at the end of the active region 1150.

Embodiments of a semiconductor device according to the present invention will be described in detail with reference to the accompanying drawings. In the present description and accompanying drawings, layers and regions prefixed with n or p mean that majority carriers are electrons or holes.

Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
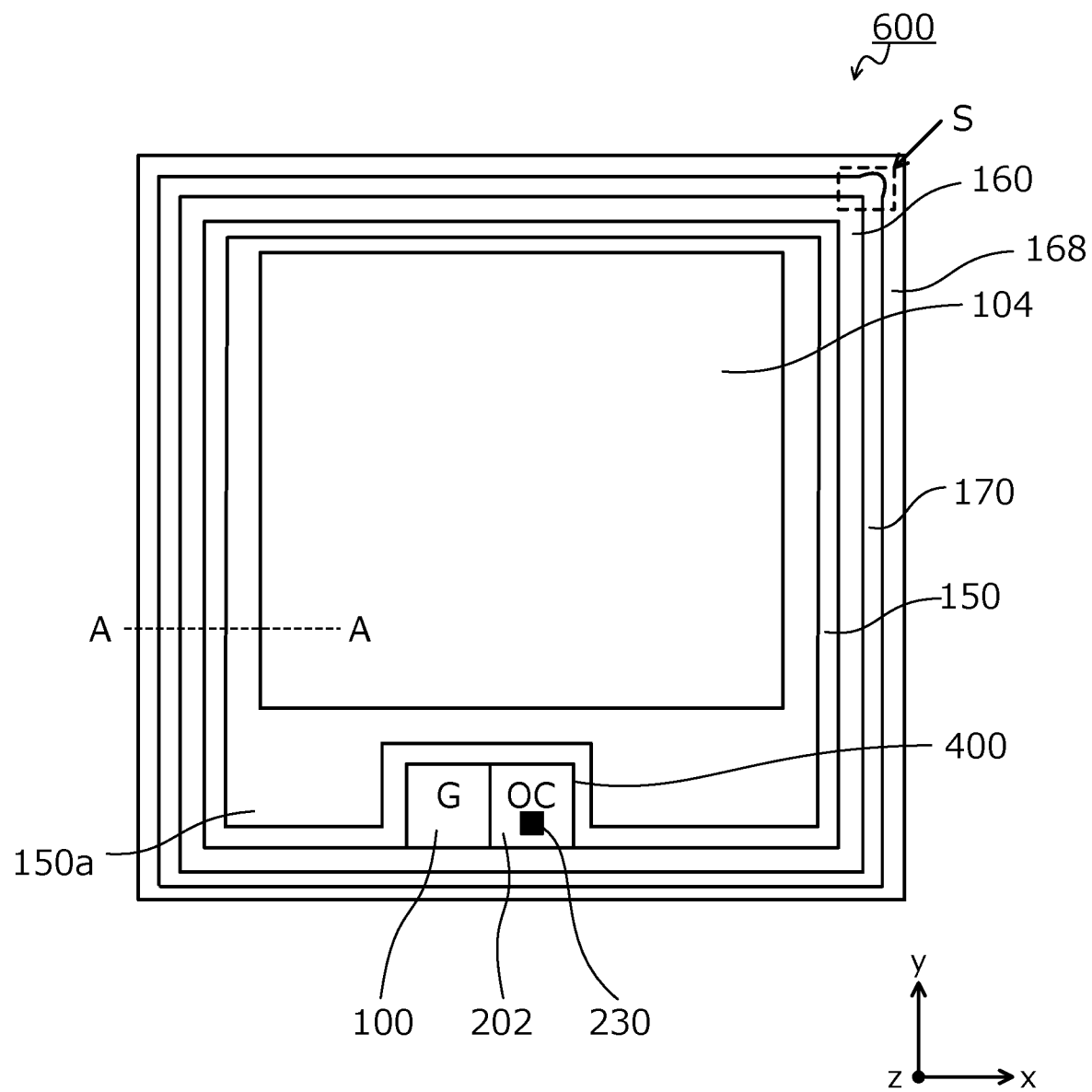
FIG. 1 is a top view of a structure of a silicon carbide semiconductor device according to a first embodiment.

A semiconductor device according to a first embodiment is configured using a semiconductor material (wide bandgap semiconductor) having a bandgap wider than that of silicon (Si). A structure of the semiconductor device according to the first embodiment will be described taking, as an example, a case in which, for example, silicon carbide (SiC) is used as the wide bandgap semiconductor. FIG. 1 is a top view of the structure of a silicon carbide semiconductor device according to the first embodiment. FIG. 1 depicts a layout of electrode pads and regions of elements disposed on a semiconductor substrate (semiconductor chip).

The silicon carbide semiconductor device according to the first embodiment and depicted in FIG. 1 has a main semiconductor element and as circuit regions for protecting and controlling the main semiconductor element such as, for example, a current sensing part, a temperature sensing part (not depicted), an over-voltage protecting part (not depicted), and an arithmetic circuit region (not depicted), on a single semiconductor substrate containing silicon carbide. The main semiconductor element is a trench-type MOSFET 600 in which drift current flows in a vertical direction (a depth direction z of the semiconductor substrate), when the main semiconductor element is ON, the main semiconductor element being configured by plural unit cells (functional units, not depicted) that are disposed adjacently to one another, the main semiconductor element performing a main operation.

The main semiconductor element is disposed in an effective region (region functioning as MOS gates) 150a of an active region 150. The effective region 150a of the active region 150 is a region through which main current flows when the main semiconductor element is ON and a periphery of the effective region 150a is surrounded by a gate ring region 160. In the effective region 150a of the active region 150, a source electrode 12 of the main semiconductor element is provided on a front surface of the semiconductor substrate. The source electrode 12 (a first source electrode 12a), for example, covers an entire surface of the effective region 150a of the active region 150. Further, on a front surface of the source electrode 12, a source electrode pad 104 having, for example, a substantially rectangular planar shape is provided.

An edge termination region 168 is a region between the active region 150 and a chip (semiconductor substrate) side surface, and is a region for mitigating electric field at a front side of the semiconductor substrate and sustaining breakdown voltage (withstand voltage). In the edge termination region 168, for example, p-type regions configuring a later-described junction termination (junction termination extension (JTE)) structure such as a guard ring or a voltage withstanding structure (not depicted) such as a field plate, a RESURF, etc. is disposed. The breakdown voltage is a voltage limit at which no errant operation or damage of an element occurs.

Further, in the active region 150, a high-function region 400 is provided adjacent to the gate ring region 160. The high-function region 400, for example, has a substantially rectangular planar shape. In the high-function region 400, high-functioning parts such as a current sensing part, a temperature sensing part (not depicted), an over-voltage protecting part (not depicted), and an arithmetic circuit region (not depicted) are provided. In FIG. 1, while only a current sensing part is depicted as a high-functioning part, high-functioning parts other than the current sensing part may be provided in the high-function region 400.

The current sensing part has a function of detecting over current (OC) flowing in the main semiconductor element. The current sensing part is a vertical MOSFET provided beneath (in the depth direction z of the semiconductor substrate) an electrode pad 202 of the current sensing part, the current sensing part having an active region 230 and a few unit cells in the active region 230, each of the unit cells having a configuration similar to that of a unit cell of the main semiconductor element.

Further, in the high-function region 400, on the front surface of the semiconductor substrate, along a border between the active region 150 and the edge termination region 168, and separate from the source electrode 12 (the first source electrode 12a) and the edge termination region 168, a gate electrode pad 100 of the main semiconductor element and the electrode pad 202 of the current sensing part are provided in contact with each other. These electrode pads, for example, have a substantially rectangular planar shape.

The gate electrode pad 100 is electrically connected to gate electrodes (refer to FIG. 2) of all the unit cells of the main semiconductor element, via a gate runner (gate wiring electrode, refer to FIG. 2) provided in the gate ring region 160. The gate ring region 160 is provided between the active region 150 and the edge termination region (termination region) 168, so as to surround the active region 150.

Further, between the gate ring region 160 and the edge termination region 168, a source ring region (ring region) 170 is provided so as to surround the gate ring region 160. The source ring region 170 has a second source electrode 12b disposed therein as described hereinafter and via a p-type base layer 6 described hereinafter, is fixed at an electric potential (source potential) of the first source electrode 12a of the active region 150. The source ring region 170 has a function of extracting, via the p-type base layer 6, hole current that flows into the active region 150 from the edge termination region 168 when the main semiconductor element is OFF. The source ring region 170 surrounds the gate ring region 160 and therefore, by extracting, via the p-type base layer 6, the hole current that flows in from the edge termination region 168, adverse effects on the active region 150 may be eliminated.

Figure 2:
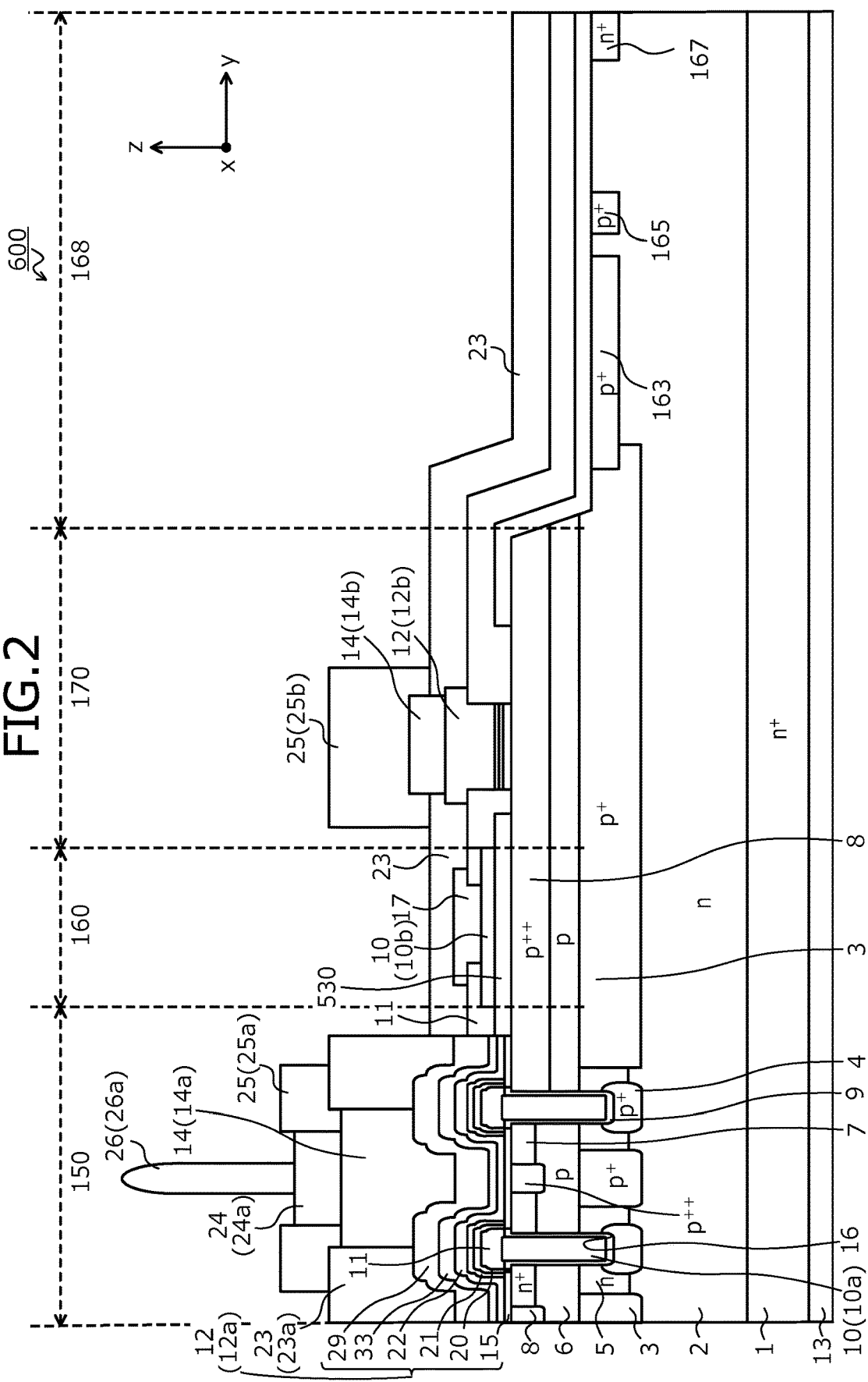
FIG. 2 is a cross-sectional view of the structure of the silicon carbide semiconductor device according to the first embodiment along cutting line A-A depicted in FIG. 1.

Next, an example of a cross-section of the structure of the active region 150, the gate ring region 160, the edge termination region 168, and the source ring region 170 described above will be described. FIG. 2 is a cross-sectional view of the structure of the silicon carbide semiconductor device according to the first embodiment along cutting line A-A depicted in FIG. 1. Only two adjacent unit cells of the main semiconductor element are depicted and other unit cells of the main semiconductor element, the unit cells that are adjacent to the depicted two unit cells and closer to a center of the chip (semiconductor substrate) than are the depicted two unit cells are not depicted.

The main semiconductor element is the trench-type MOSFET 600 that includes MOS gates having a trench gate structure at a front side of the semiconductor substrate (side having the p-type base layer 6). A silicon carbide semiconductor base is formed by epitaxially growing an n-type silicon carbide epitaxial layer (a first semiconductor layer of the first conductivity type) 2 and a p-type base layer (second semiconductor layer of a second conductivity type) 6, sequentially, on an $n^+$-type silicon carbide substrate (semiconductor substrate of a first conductivity type) 1 that contains silicon carbide. On the n-type silicon carbide epitaxial layer 2, an n-type high-concentration region 5 may be epitaxially grown.

In the active region 150, the MOS gates are provided, the MOS gates being configured by the p-type base layer 6, $n^+$-type source regions (first semiconductor regions of the first conductivity type) 7, $p^{++}$-type contact regions 8, trenches 16, a gate insulating film 9, and first gate electrodes 10a.

In particular, the trenches 16 penetrate through the p-type base layer 6 in the depth direction z from the front surface of the semiconductor substrate and reach the n-type high-concentration region 5 described hereinafter (in a case where the n-type high-concentration region 5 is not provided, the trenches 16 reach the n-type silicon carbide epitaxial layer 2, hereinafter indicated as "(2)"). The depth direction z is a direction from the front surface of the semiconductor substrate toward a back surface. The trenches 16, for example, are disposed in a striped pattern.

The trenches 16, for example, may be disposed in a matrix-like pattern as viewed from the front side of the semiconductor substrate. In each of the trenches 16, along an inner wall of the trench 16, the gate insulating film 9 is provided and on the gate insulating film 9, one of the first gate electrodes 10a is provided so as to be embedded in the trench 16. One unit cell of the main semiconductor element is configured by the first gate electrode 10a of one of the trenches 16 and adjacent mesa regions facing each other across the first gate electrode 10a (a mesa region being a region between adjacent trenches 16).

In a surface layer of a source side (side facing the first source electrode 12a) of the n-type silicon carbide epitaxial layer 2, an n-type region (hereinafter, n-type high-concentration region) 5 may be provided so as to be in contact with the p-type base layer 6. The n-type high-concentration region 5 is a so-called current spreading layer (CSL) that reduces carrier spreading resistance. The n-type high-concentration region 5, for example, is provided uniformly along a direction parallel to a substrate front surface (the front surface of the semiconductor substrate) so as to be exposed at the inner walls of the trenches 16.

The n-type high-concentration region 5 reaches a position deeper toward a drain side (side having a back electrode 13) from an interface with the p-type base layer 6 than are bottoms of the trenches 16. In the n-type high-concentration region 5, first and second $p^+$-type base regions 3, 4 may be selectively provided. The first $p^+$-type base regions 3 are provided between adjacent trenches 16 (in mesa regions) to be separate from the second $p^+$-type base regions 4 and the trenches 16, and in contact with the p-type base layer 6. Of the bottoms and bottom corner portions of the trenches 16, the second $p^+$-type base regions 4 underlie at least the bottoms. The bottom corner portions the trenches 16 are borders between the bottoms and sidewalls of the trenches 16.

Pn junctions between the first and the second $p^+$-type base regions 3, 4 and the n-type high-concentration region 5 (2) are formed at positions deeper toward the drain side than are the bottoms of the trenches 16. The first and the second $p^+$-type base regions 3, 4 may be provided in the n-type silicon carbide epitaxial layer 2 without the n-type high-concentration region 5 being provided. Depth positions of drain-side ends of the first and the second $p^+$-type base regions 3, 4 suffice to be positions such that the pn junctions between the first and the second $p^+$-type base regions 3, 4 and the n-type high-concentration region 5 (2) are deeper toward the drain side than are the bottoms of the trenches 16 and may be variously changed according to design conditions. Application of high electric field to the gate insulating film 9 at parts along the bottoms of the trenches 16 may be prevented by the first and the second $p^+$-type base regions 3, 4.

In the p-type base layer 6, the $n^+$-type source regions 7 are selectively provided. The $p^{++}$-type contact regions 8 may be selectively provided so as to be in contact with the $n^+$-type source regions 7. The $n^+$-type source regions 7 are in contact with the gate insulating film 9 at the sidewalls of the trenches 16 and face the first gate electrodes 10a across the gate insulating film 9 at the sidewalls of the trenches 16.

An interlayer insulating film 11 is provided at an entire area of the front surface of the semiconductor substrate so as to cover the first gate electrodes 10a and later-described second gate electrode 10b of the gate ring region 160. All the first gate electrodes 10a are electrically connected to the gate electrode pad 100 (refer to FIG. 1) via the second gate electrode 10b of the gate ring region 160 and a gate wiring electrode 17. In the interlayer insulating film 11, contact holes that penetrate through the interlayer insulating film 11 in the depth direction z and reach the substrate front surface are formed.

A first source electrode (first first-electrode) 12a is in ohmic contact with the semiconductor substrate (the $n^+$-type source regions 7) in the contact holes and is electrically insulated from the first gate electrodes 10a by the interlayer insulating film 11. The first source electrode 12a is a multilayered film in which NiSi electrodes 15, a first TiN film 20, a first Ti film 21, a second TiN film 22, a second Ti film 33, and an Al alloy film 29 are sequentially stacked on the $n^+$-type source regions 7. In a case where the $p^{++}$-type contact regions 8 are provided, the first source electrode 12a is in ohmic contact with the $p^{++}$-type contact regions 8.

On the first source electrode 12a, a first end of a first external electrode pin (first electrode pin) 26a is bonded via a first plating film (first plating film) 14a and a first solder (first solder) 24a. Of these, the first plating film 14a corresponds to the source electrode pad 104. A second end of the first external electrode pin 26a is bonded to a metal bar (not depicted) disposed so as to face the front surface of the semiconductor substrate. Further, the second end of the first external electrode pin 26a is exposed outside a case (not depicted) in which the semiconductor chip is mounted and is electrically connected to an external device (not depicted). Parts of a surface of the first source electrode 12a other than the first plating film 14a are covered by a first protective film 23. In particular, the first protective film 23 is provided so as to cover the first source electrode 12a; and in openings of the first protective film 23, the first plating film 14a is provided. The first external electrode pin 26a is bonded at a surface of the first plating film 14a via the first solder 24a. To limit a region of the first solder 24a, a first second-protective film 25a may be provided at the surface of the first plating film 14a. The first protective film 23 and a second protective film 25, for example, are polyimide films.

At a back surface of the $n^+$-type silicon carbide substrate 1, the back electrode (second electrode) 13 forming a drain electrode is provided. On the back electrode 13, a drain electrode pad (not depicted) is provided.

Further, in the gate ring region 160, on the p$^{++}$-type contact regions 8 of the silicon carbide semiconductor base, the second gate electrode 10b is provided via an insulating film (first insulating film) 530. The second gate electrode 10b is insulated from the p$^{++}$-type contact region 8 by the insulating film 530. The second gate electrode 10b is covered by the interlayer insulating film 11. In the interlayer insulating film 11, a contact hole that penetrates through the interlayer insulating film 11 in the depth direction z and reaches the second gate electrode 10b is formed. In the contact hole, the gate wiring electrode 17 is embedded. The gate wiring electrode 17 electrically connects the first gate electrodes 10a in the active region 150 to the gate electrode pad 100. Further, the first protective film 23 is provided on the interlayer insulating film 11 and the gate wiring electrode 17.

In the edge termination region 168, the p$^{++}$-type contact region 8 and the p-type base layer 6 are removed from an entire area of the edge termination region 168, thereby forming at a front surface of the silicon carbide semiconductor base, a recess (curved away from the drain side) where the edge termination region 168 is lower than the active region 150 and the n-type silicon carbide epitaxial layer 2 is exposed at a bottom of the recess. Further, in the edge termination region 168, a JTE structure is provided in which plural p$^+$-type regions (herein, two regions including a first JTE region 163 and a second JTE region 165) are disposed adjacently to each other. Further, an n$^+$-type stopper region 167 that functions as a channel stopper is provided outside (closer to a chip end than is) the JTE structure.

The first JTE region 163 and the second JTE region 165 are each selectively provided at parts of the n-type silicon carbide epitaxial layer 2 exposed at the bottom of the recess. When high voltage is applied, high breakdown voltage in a horizontal direction other than that in the active region 150 is secured by pn junctions between the first JTE region 163, the second JTE region 165, and the n-type silicon carbide epitaxial layer 2.

Further, in the source ring region 170, the interlayer insulating film 11 is provided on the p$^{++}$-type contact region 8 (in a case where the p$^{++}$-type contact regions 8 are not provided, on the p-type base layer 6, hereinafter indicated as "(6)") of the silicon carbide semiconductor base. In the interlayer insulating film 11, a contact hole that penetrates through the interlayer insulating film 11 in the depth direction z and reaches the p$^{++}$-type contact region 8 (6) is formed. In the contact hole, the second source electrode 12b is embedded. Therefore, the second source electrode (second first-electrode) 12b, similarly to the first source electrode 12a, is provided on the p$^{++}$-type contact region 8 (6). The second source electrode 12b, similarly to the first source electrode 12a, is a multilayered film in which the NiSi electrode 15, the first TiN film 20, the first Ti film 21, the second TiN film 22, the second Ti film 33, and the Al alloy film 29 are sequentially stacked. In the silicon carbide semiconductor base, the p-type regions (the p$^{++}$-type contact regions 8 (6), etc.) provided at a lower part of the active region 150 and the p-type regions provided at a lower part of the source ring region 170 are connected and therefore, the second source electrode 12b has an electric potential equal to that of the first source electrode 12a.

A plating film (second plating film) 14 is provided at a surface of the second source electrode 12b and a part of the plating film 14 excluding a second plating film 14b is covered by the first protective film 23. In particular, the first protective film 23 is provided so as to cover the second source electrode 12b and the second plating film 14b is provided in the opening of the first protective film 23. The second plating film 14b and the first protective film 23 may be partially covered by a second second-protective film 25b. The second plating film 14b may be provided at an entire surface of the second source electrode 12b or may be selectively provided, for example, only at the second source electrode 12b at corner parts of the source ring region 170.

As described above, the source ring region 170 has a function of extracting, via the p-type base layer 6, hole current that flows into the active region 150 from the edge termination region 168 when the main semiconductor element is OFF. Therefore, current concentration at an end of the active region 150 may be mitigated by the source ring region 170. Further, the second plating film 14b is provided on the second source electrode 12b, whereby resistance of the second source electrode 12b is reduced, enabling breakdown tolerance of the second source electrode 12b to be improved. Further, at corner parts of the active region 150 and of the edge termination region 168, the source ring region 170 bulges outward, whereby a width of the source ring region 170 may be set to be wider than a width of a linear part thereof and a width of the corner parts of the second source electrode 12b may be set to be wider than a width of a linear part thereof (refer to region Sin FIG. 1). In FIG. 1, while only one corner is widened, all four corners may be widened or only two of the corners may be widened. As a result, extraction of the hole current is facilitated, enabling current concentration at the active region 150 to be further mitigated. Furthermore, a mathematical area of contact between the second source electrode 12b and silicon carbide semiconductor base (the p$^{++}$-type contact region 8 and when the p$^{++}$-type contact region 8 is not provided, the p-type base layer 6) may be at least two times a mathematical area of contact between the first source electrode 12a and the silicon carbide semiconductor base (each of the p$^{++}$-type contact regions 8 and when the p$^{++}$-type contact regions 8 are not provided, the p-type base layer 6).

Next, a method of manufacturing the silicon carbide semiconductor device according to the first embodiment will be described. FIGS. 3, 4, 5, 6, 7, and 8 are cross-sectional views depicting states of the silicon carbide semiconductor device according to the present embodiment during manufacture.

Figure 3:
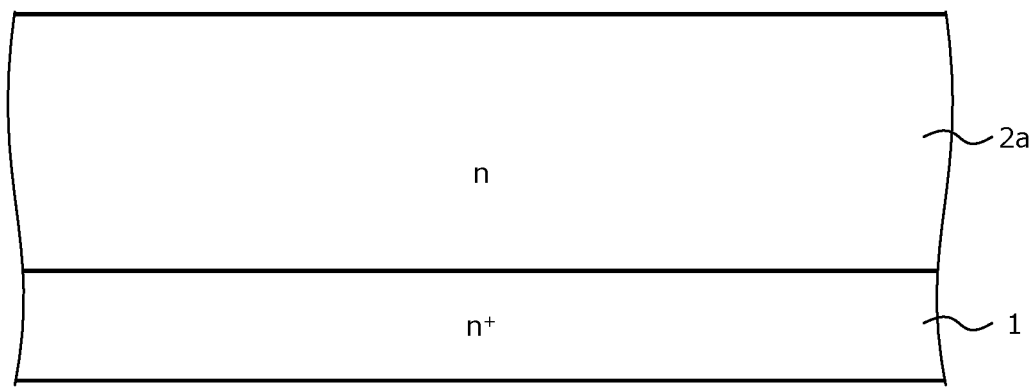
FIG. 3 is a cross-sectional view depicting a state of the silicon carbide semiconductor device according to the first embodiment during manufacture.

First, the n$^+$-type silicon carbide substrate 1 containing an n-type silicon carbide is prepared. Subsequently, on a first main surface of the n$^+$-type silicon carbide substrate 1, a first n-type silicon carbide epitaxial layer 2a containing silicon carbide is formed by epitaxial growth to have a thickness of, for example, about 30 μm while an n-type impurity, for example, nitrogen atoms (N) is doped. The state up to here is depicted in FIG. 3.

Next, on the surface of the first n-type silicon carbide epitaxial layer 2a, an ion implantation mask having predetermined openings is formed by a photolithographic technique using, for example, an oxide film. Subsequently, a p-type impurity such as aluminum is implanted in the openings of the oxide film, thereby forming lower first p$^+$-type base regions 3a and the second p$^+$-type base regions 4 at a depth of about 0.5 μm.

Furthermore, formation is such that a distance between a lower first p$^+$-type base regions 3a and a second p$^+$-type base regions 4 that are adjacent to one another is about 1.5 μm. An impurity concentration of the lower first p$^+$-type base regions 3a and the second p$^+$-type base regions 4 is set to be, for example, about 5×10$^{18}$/cm$^3$.

Figure 4:
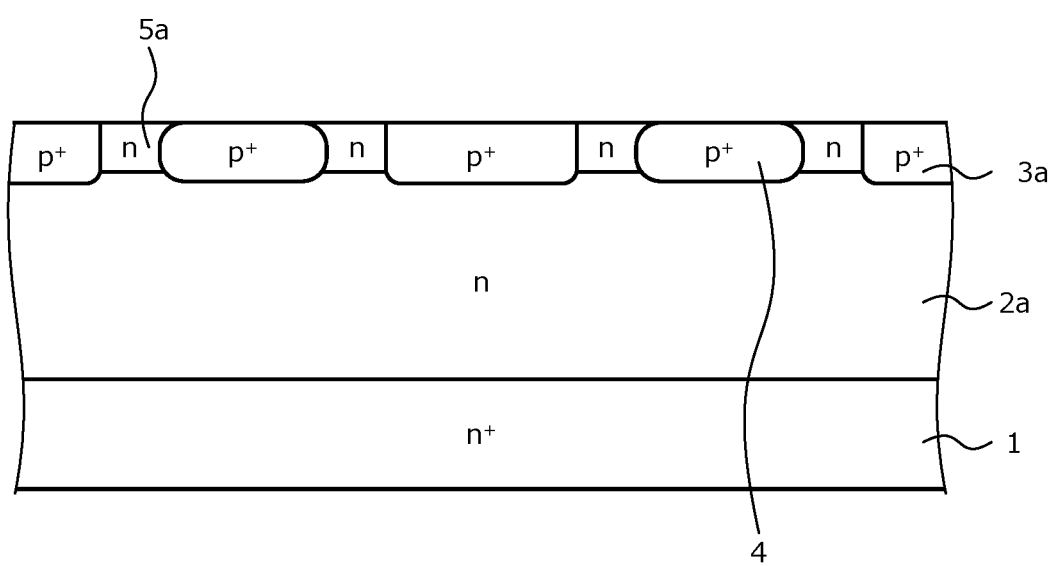
FIG. 4 is a cross-sectional view depicting a state of the silicon carbide semiconductor device according to the first embodiment during manufacture.

Next, lower n-type high-concentration regions 5a may be formed at a depth of, for example, about 0.5 μm, in parts of a surface region of the first n-type silicon carbide epitaxial layer 2a, by partially removing the ion implantation mask and ion-implanting an n-type impurity such as nitrogen in the openings. An impurity concentration of the lower n-type high-concentration regions 5a may be set to be, for example, about $1 \times 10^{17}/cm^3$. The state up to here is depicted in FIG. 4.

Next, on the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set to become about $3 \times 10^{15}/cm^3$. Hereinafter, the first n-type silicon carbide epitaxial layer 2a and the second n-type silicon carbide epitaxial layer 2b collectively are the n-type silicon carbide epitaxial layer 2.

Next, on the surface of the second n-type silicon carbide epitaxial layer 2b, an ion implantation mask having predetermined openings is formed by photolithography using, for example, an oxide film. Subsequently, a p-type impurity such as aluminum is implanted in the openings of the oxide film, thereby forming upper first $p^+$-type base regions 3b at a depth of about 0.5 μm so as to overlap the lower first $p^+$-type base regions 3a. The lower first $p^+$-type base regions 3a and the upper first $p^+$-type base regions 3b form continuous regions and thereby, form the first $p^+$-type base regions 3. An impurity concentration of the upper first $p^+$-type base regions 3b may be set to become, for example, about $5 \times 10^{18}/cm^3$.

Figure 5:
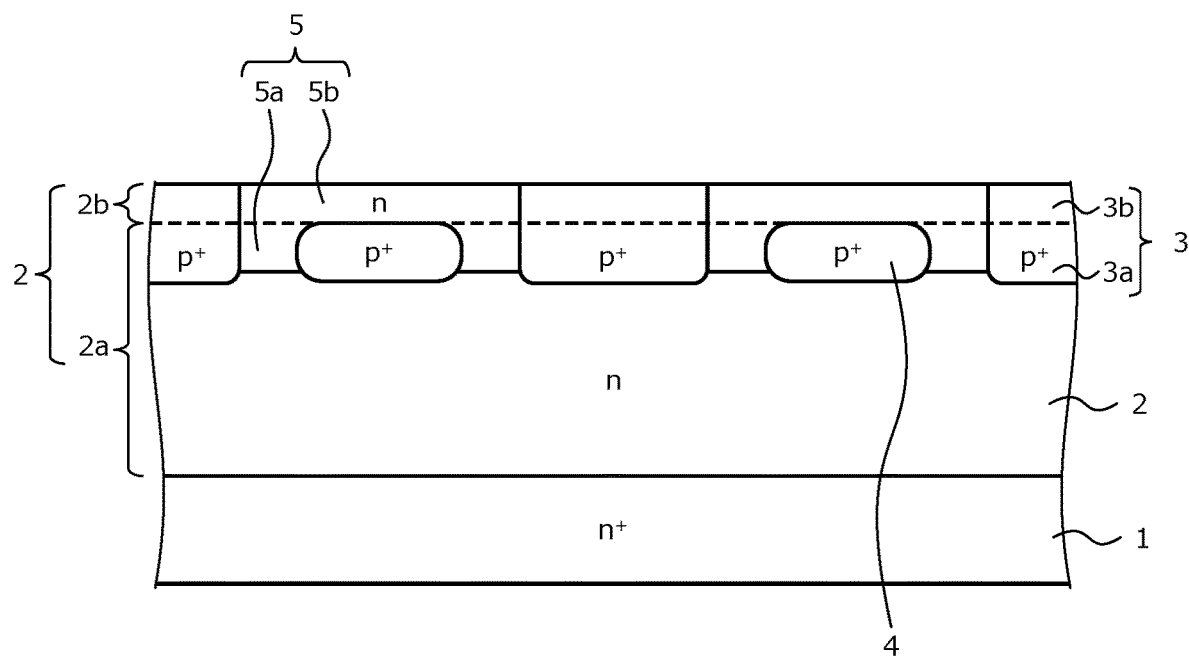
FIG. 5 is a cross-sectional view depicting a state of the silicon carbide semiconductor device according to the first embodiment during manufacture.

Next, upper n-type high-concentration regions 5b may be formed at a depth of, for example, about 0.5 μm, in parts of a surface region of the second n-type silicon carbide epitaxial layer 2b, by partially removing the ion implantation mask and implanting an n-type impurity such as nitrogen in the openings. An impurity concentration of the upper n-type high-concentration regions 5b is set to be, for example, about $1 \times 10^{17}/cm^3$. The upper n-type high-concentration regions 5b are formed to at least partially contact the lower n-type high-concentration regions 5a, whereby the n-type high-concentration region 5 is formed. However, the n-type high-concentration region 5 may formed at an entire substrate surface or may be omitted. The state up to here is depicted in FIG. 5.

Next, in the surface of the n-type silicon carbide epitaxial layer 2, the p-type base layer 6 is formed by epitaxial growth to have a thickness of about 1.1 μm. An impurity concentration of the p-type base layer 6 is set to be about $4 \times 10^{17}/cm^3$. After the p-type base layer 6 is formed by epitaxial growth, the p-type base layer 6 may be further ion-implanted with a p-type impurity such as aluminum.

Figure 6:
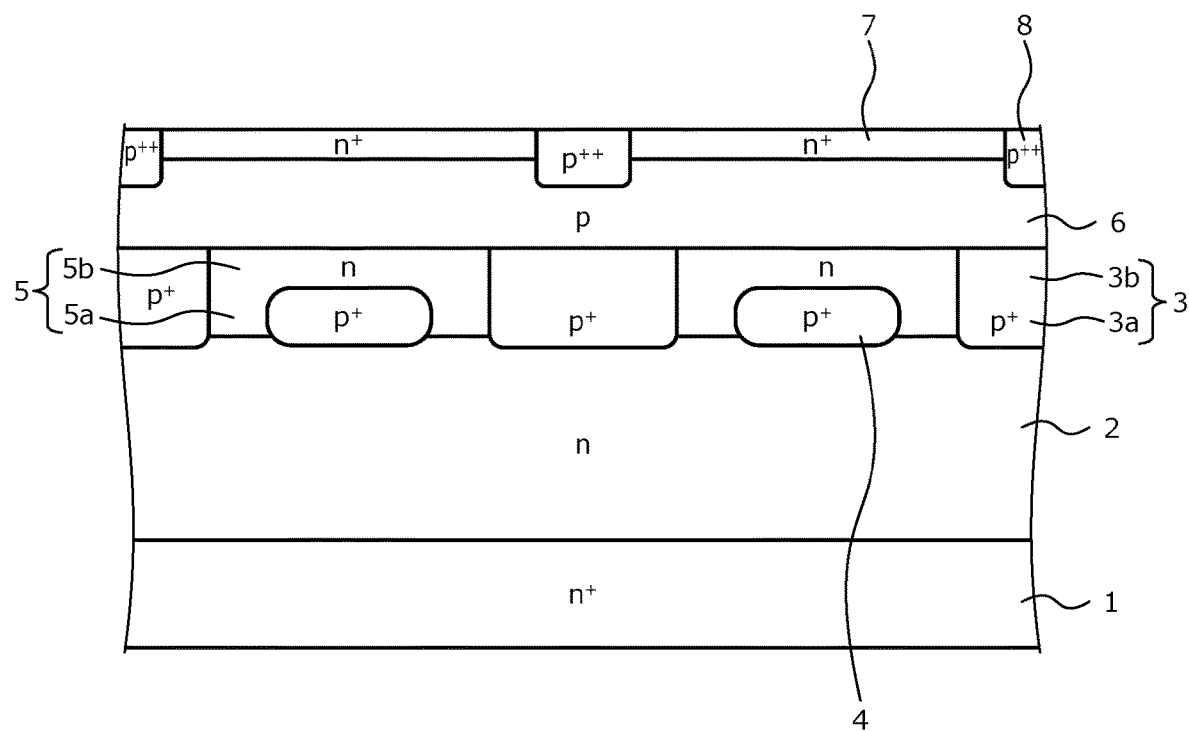
FIG. 6 is a cross-sectional view depicting a state of the silicon carbide semiconductor device according to the first embodiment during manufacture.

Next, on the surface the p-type base layer 6, an ion implantation mask having predetermined openings is formed by photolithography using, for example, an oxide film. An n-type impurity such as nitrogen (N) or phosphorus (P) is ion-implanted in the openings, thereby forming the $n^+$-type source regions 7 at parts of the surface of the p-type base layer 6. Next, the ion implantation mask used in forming the $n^+$-type source regions 7 is removed and by a similar method, an ion implantation mask having predetermined openings may be formed, a p-type impurity such as phosphorus may be ion-implanted at portions of the surface of the p-type base layer 6, whereby the $p^{++}$-type contact regions 8 may be formed. An impurity concentration of the $p^{++}$-type contact regions 8 is set to be higher than the impurity concentration of the p-type base layer 6. The state up to here is depicted in FIG. 6.

Next, a heat treatment (annealing) is performed in an inert gas atmosphere of about 1700 degrees C., implementing an activation process for the first $p^+$-type base regions 3, the second $p^+$-type base regions 4, the $n^+$-type source regions 7, and the $p^{++}$-type contact regions 8. As described above, ion-implanted regions may be collectively activated by a single heat treatment or may be activated by performing a heat treatment each time ion implantation is performed.

Figure 7:
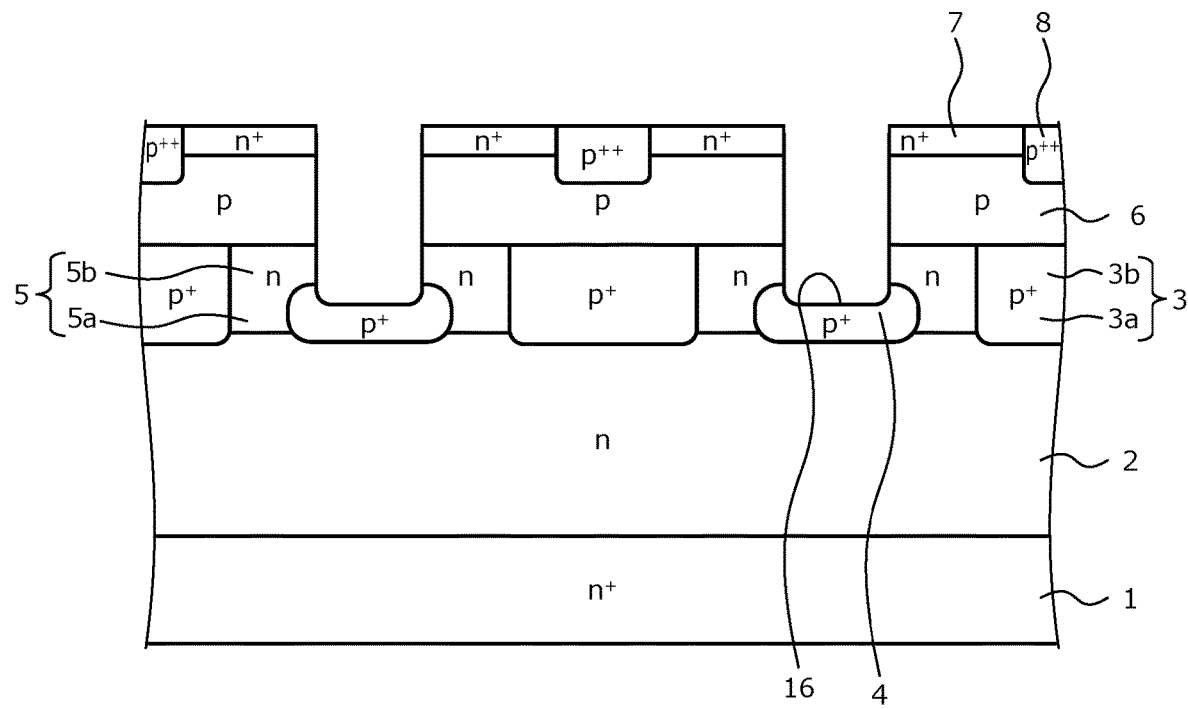
FIG. 7 is a cross-sectional view depicting a state of the silicon carbide semiconductor device according to the first embodiment during manufacture.

Next, on the surface of the p-type base layer 6, a trench formation mask having predetermined openings is formed by photolithography, for example, using an oxide film. Next, the trenches 16 that penetrate through the p-type base layer 6 and reach the n-type high-concentration region 5 (2) are formed by dry etching. The bottoms of the trenches 16 may reach the second $p^+$-type base regions 4 formed in the n-type high-concentration region 5 (2). Next, the trench formation mask is removed. The state up to here is depicted in FIG. 7.

Next, the gate insulating film 9 is formed along the surface of the $n^+$-type source regions 7 and along the bottoms and sidewalls of the trenches 16. The gate insulating film 9 may be formed by thermal oxidation at a temperature of about 1000 degrees C. in an oxygen atmosphere. Further, the gate insulating film 9 may be formed by a deposition method by a chemical reaction such as that for a high temperature oxide (HTO).

Next, a polycrystalline silicon layer doped with, for example, phosphorus atoms is provided on the gate insulating film 9. The polycrystalline silicon layer may be formed to be embedded in the trenches 16. The polycrystalline silicon layer is patterned by photolithography and left in the trenches 16, whereby the first gate electrodes 10a are formed.

Figure 8:
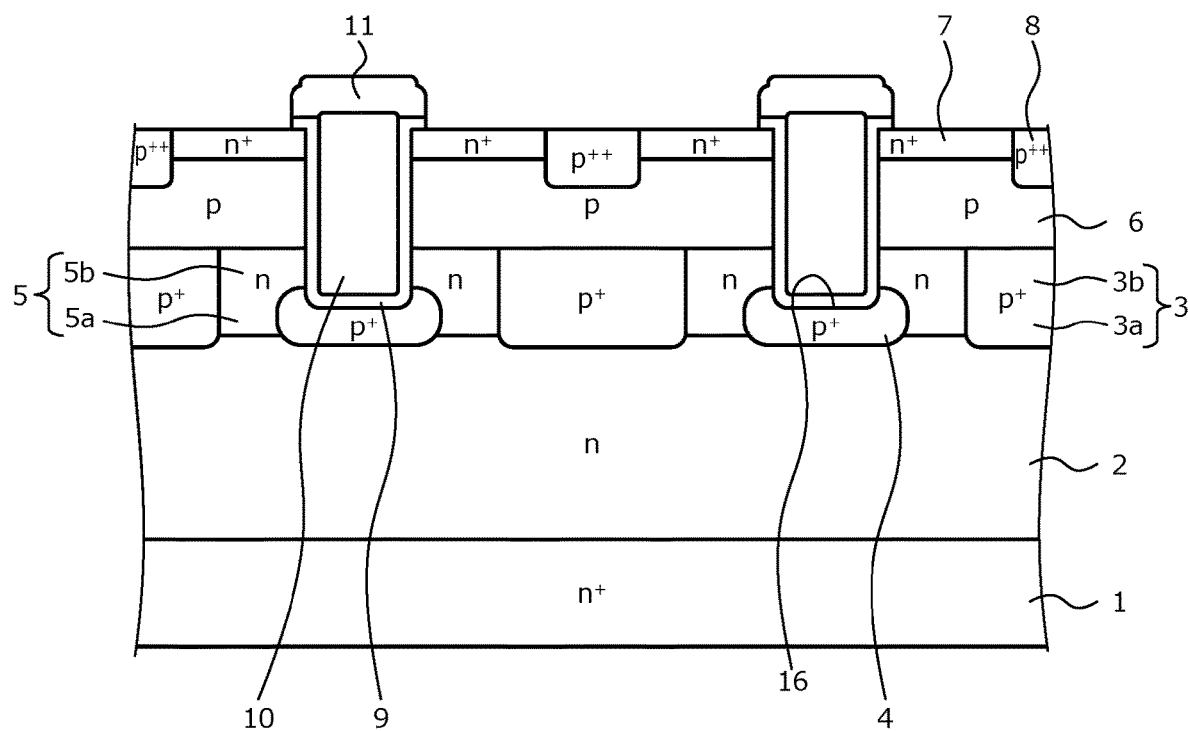
FIG. 8 is a cross-sectional view depicting a state of the silicon carbide semiconductor device according to the first embodiment during manufacture.

Next, for example, phosphate glass is deposited so as to cover the gate insulating film 9 and the first gate electrodes 10a and to have a thickness of about 1 μm, whereby the interlayer insulating film 11 is formed. Next, a barrier metal formed by titanium (Ti) or titanium nitride (TiN) or stacked layers of titanium and titanium nitride may be formed so as to cover the interlayer insulating film 11. The interlayer insulating film 11 and the gate insulating film 9 are patterned by photolithography, whereby contact holes exposing the $n^+$-type source regions 7 and the $p^{++}$-type contact regions 8 are formed. Thereafter, a heat treatment (reflow) is performed, thereby planarizing the interlayer insulating film 11. The state up to here is depicted in FIG. 8. Further, after the contact holes are formed in the interlayer insulating film 11, a barrier metal formed by titanium (Ti) or titanium nitride (TiN) or stacked layers of titanium and titanium nitride may be formed. In this case, contact holes exposing the $n^+$-type source regions 7 and the $p^{++}$-type contact regions 8 are also formed in the barrier metal.

Next, on the interlayer insulating film 11 and in the contact holes provided in the interlayer insulating film 11, a conductive film that forms the NiSi electrodes 15 is formed. The conductive film, for example, is a nickel (Ni) film. Further, at a second main surface of the $n^+$-type silicon carbide substrate 1, a nickel (Ni) film is similarly formed. Thereafter, a heat treatment is performed at a temperature of, for example, about 970 degrees C., whereby the nickel film in the contact holes is converted into a silicide, thereby forming the NiSi electrodes 15. Concurrently, the nickel film formed at the second main surface forms the back electrode 13 that is in ohmic contact with the $n^+$-type silicon carbide substrate 1. Thereafter, unreacted parts of the nickel film are selectively removed, for example, leaving that only in the contact holes as the NiSi electrodes 15. In the source ring region 170 as well, the first gate electrodes 10a and the NiSi electrodes 15 are similarly formed.

Next, for example, by sputtering, the first TiN film 20, the first Ti film 21, the second TiN film 22, and the second Ti film 33 are sequentially stacked so as to cover the NiSi electrodes 15 and the interlayer insulating film 11 of the front surface of the silicon carbide semiconductor base and the Al alloy film 29 is further formed to have a thickness of, for example, about 5 µm. The Al alloy film 29 may be an Al film. The Al alloy film 29, for example, may be an Al—Si film or an Al—Si—Cu film. The conductive film is patterned by photolithography and is left in the active region 150 of the element overall, thereby forming the first source electrode 12a. Similarly, in the source ring region 170 as well, the first TiN film 20, the first Ti film 21, the second TiN film 22, and the second Ti film 33 are sequentially stacked and the Al alloy film 29 is further formed, whereby the second source electrode 12b is formed.

Next, after a polyimide film is formed on the Al alloy film 29, the polyimide film is selectively removed by photolithography and etching, thereby forming the first protective film 23 and openings in the first protective film 23. Next, on the Al alloy film 29 exposed in the openings of the first protective film 23, the first plating film 14a is formed. Similarly, in the source ring region 170 as well, the second plating film 14b and the first protective film 23 are formed.

Next, the first second-protective film 25a is formed so as to cover a border between the first plating film 14a and the first protective film 23. The first second-protective film 25a, for example, is a polyimide film. Thereafter, the first external electrode pin 26a is formed at the first plating film 14a via the first solder 24a.

In this manner, the semiconductor device depicted in FIG. 1 is completed.

As described above, according to the silicon carbide semiconductor device according to the first embodiment, between the gate ring region and the edge termination region, the source ring region is provided so as to surround the gate ring region. In the source ring region, the second source electrode is provided, the second source electrode having a function of extracting, via the p-type base layer, hole current that flows into the active region from the edge termination region when the main semiconductor element is OFF. Therefore, current concentration at ends of the active region may be mitigated by the source ring region. Moreover, even when avalanche carriers rapidly increase due to cosmic rays, absorption by the source ring is possible and therefore, avalanche carriers are prevented from reaching the active region and the breakdown tolerance may be improved. Further, the plating film is provided on the second source electrode of the source ring region, whereby the resistance of the second source electrode is reduced and the breakdown tolerance of the second source electrode may be improved.

Figure 9:
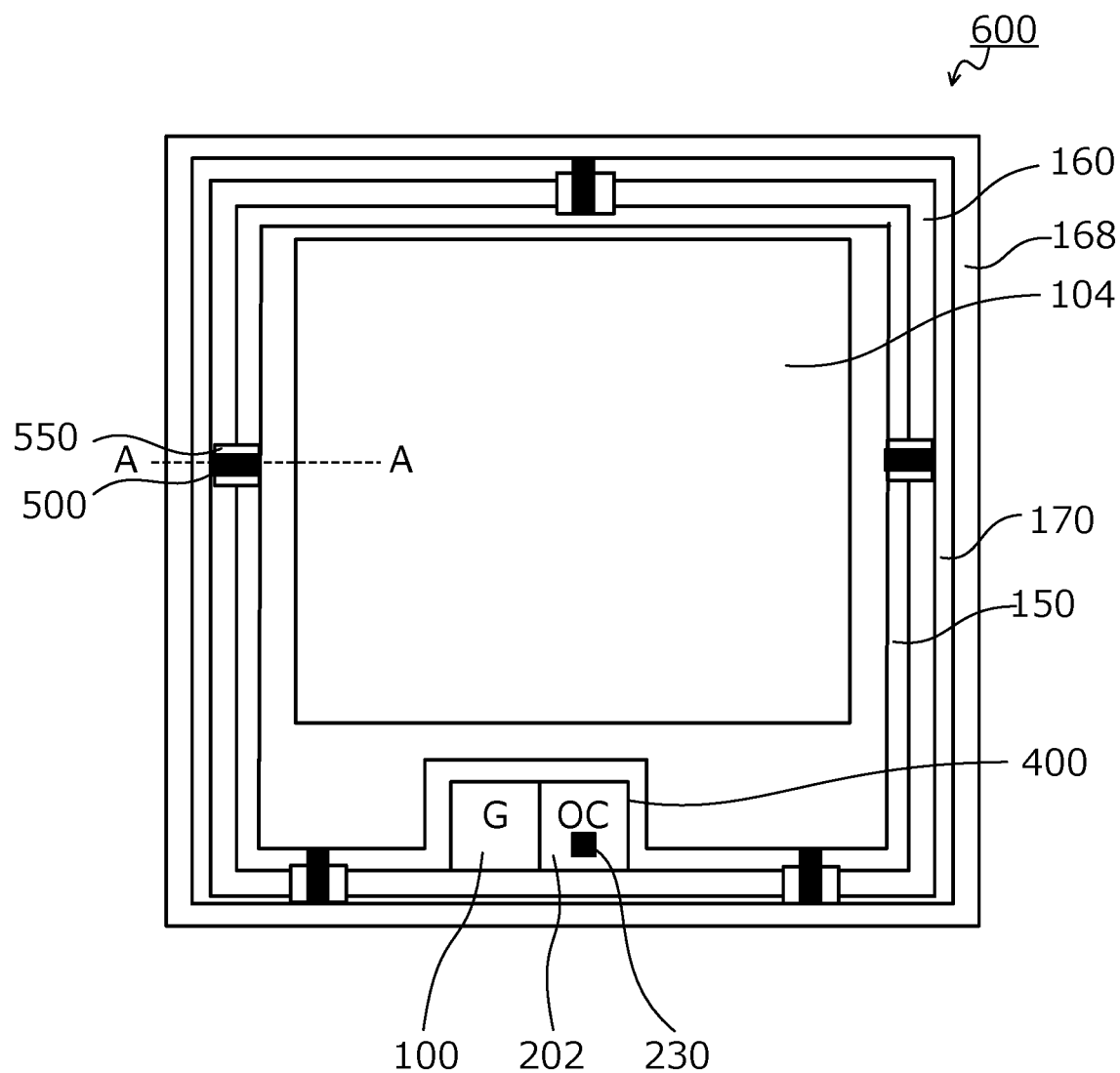
FIG. 9 is a top view of a structure of a silicon carbide semiconductor device according to a second embodiment.

Next, a structure of a silicon carbide semiconductor device according to a second embodiment will be described. FIG. 9 is a top view of the structure of the silicon carbide semiconductor device according to the second embodiment. The silicon carbide semiconductor device according to the second embodiment differs from the silicon carbide semiconductor device according to the first embodiment in that short-circuit electrodes 500 that connect the first source electrode 12a of the active region 150 and the second source electrode 12b of the source ring region 170 are provided.

Figure 10:
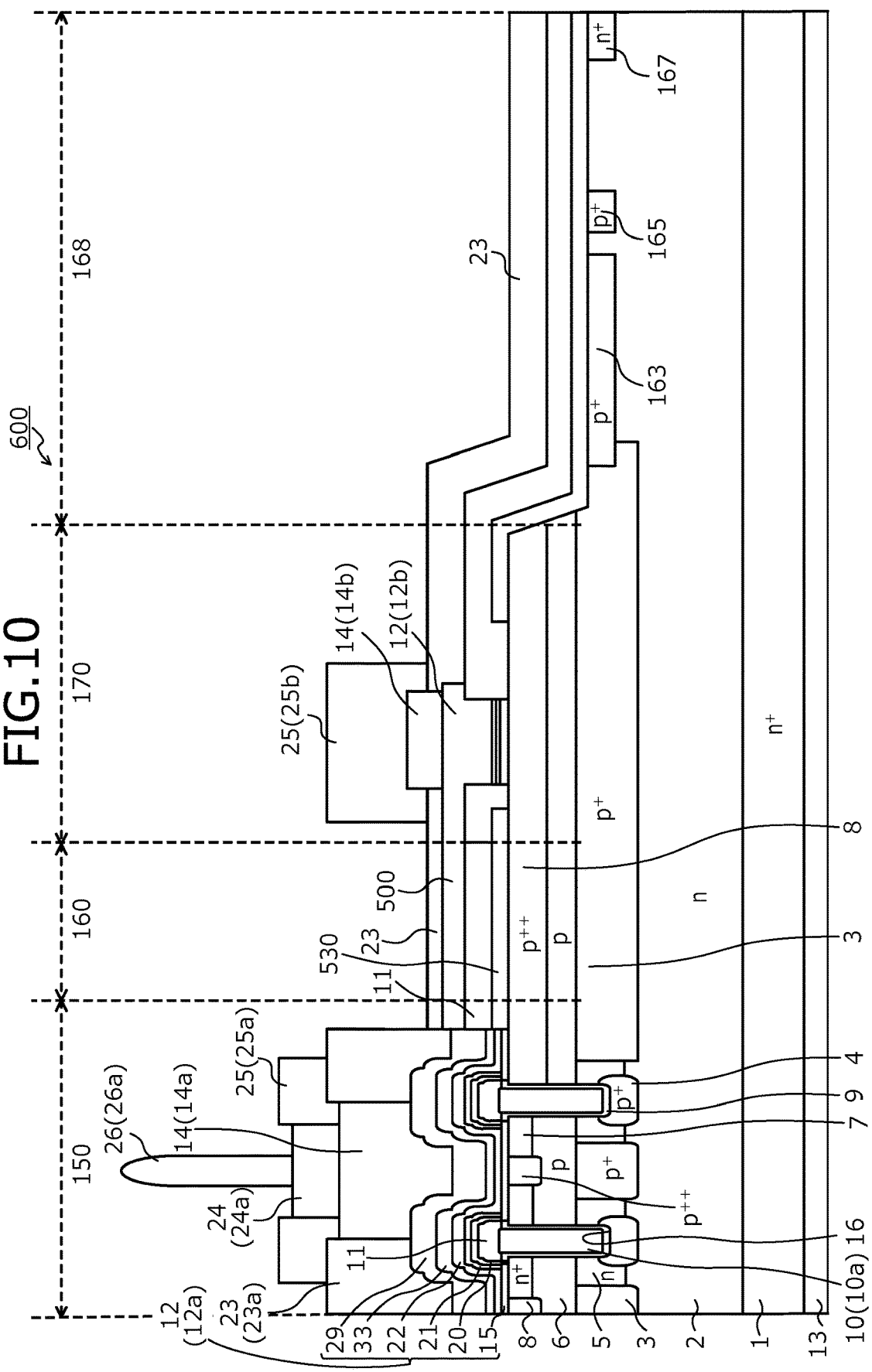
FIG. 10 is a cross-sectional view of the structure of the silicon carbide semiconductor device according to the second embodiment along cutting line A-A depicted in FIG. 9.

In particular, dividing regions 550 are provided in the gate ring region 160 and in the dividing regions 550, the short-circuit electrodes 500 are provided without the second gate electrode 10b and without the gate wiring electrode 17 being provided. FIG. 10 is a cross-sectional view of the structure of the silicon carbide semiconductor device according to the second embodiment along cutting line A-A depicted in FIG. 9. FIG. 10 is a cross-sectional view of a part where one of the short-circuit electrodes 500 is provided. As depicted in FIG. 10, in the gate ring region 160, the insulating film 530 and the interlayer insulating film 11 are provided on the $p^{++}$-type contact region 8 of the silicon carbide semiconductor base and the short-circuit electrode 500 is provided on the interlayer insulating film 11. The first source electrode 12a and the second source electrode 12b are connected by the short-circuit electrode 500, whereby the hole current extracted by the source ring region 170 may flow from the second source electrode 12b to the first source electrode 12a and current concentration at ends of the active region 150 may be further mitigated.

At least one of the short-circuit electrodes 500 suffices to be provided on the semiconductor chip 600. However, to reduce the resistance between the first source electrode 12a and the second source electrode 12b, as depicted in FIG. 9, one or more of the short-circuit electrodes 500 may be provided on each side. Further, in parts where the dividing regions 550 are provided, a path from the second gate electrode 10b to the gate electrode pad 100 becomes longer and resistance increases. Therefore, in the part where the dividing regions 550 are provided, configuration may be such that no MOS structure is configured, for example, the $n^+$-type source regions 7 are not provided. Herein, in the dividing regions 550, the second gate electrode 10b and the gate wiring electrode 17 are not formed and therefore, the second gate electrode 10b does not form a ring-shape. Thus, when the dividing regions 550 are provided in plural, to apply all the voltage to the second gate electrode 10b, the positions of the dividing regions 550 on two sides that are orthogonal to a direction in which the trenches 16 extend in the striped pattern may be shifted (staggered) relative to each other.

As described above, according to the second embodiment, the short-circuit electrodes that connect the first source electrode and the second source electrode are provided, whereby the hole current extracted by the source ring region may flow to the first source electrode and current concentration at ends of the active region may be further mitigated. Furthermore, effects similar to those of the first embodiment may be obtained.

Figure 11:
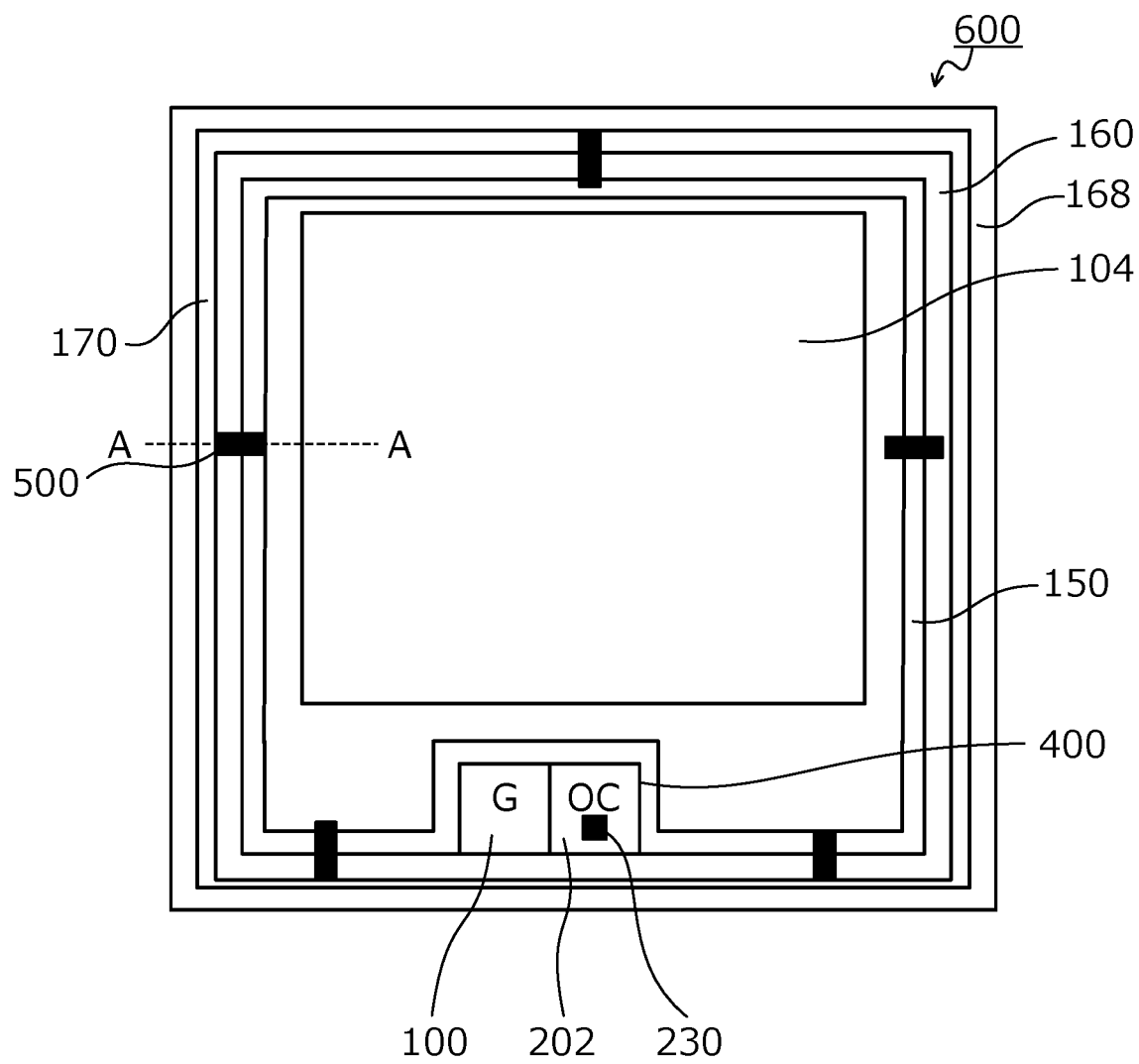
FIG. 11 is a top view of a structure of a silicon carbide semiconductor device according to a third embodiment.

Next, a structure of a silicon carbide semiconductor device according to a third embodiment will be described. FIG. 11 is a top view of the structure of the silicon carbide semiconductor device according to the third embodiment. The silicon carbide semiconductor device according to the third embodiment differs from the silicon carbide semiconductor device according to the second embodiment in that the short-circuit electrodes 500 that connect the first source electrode 12a of the active region 150 and the second source electrode 12b of the source ring region 170 are provided without provision of the dividing regions 550.

Figure 12:
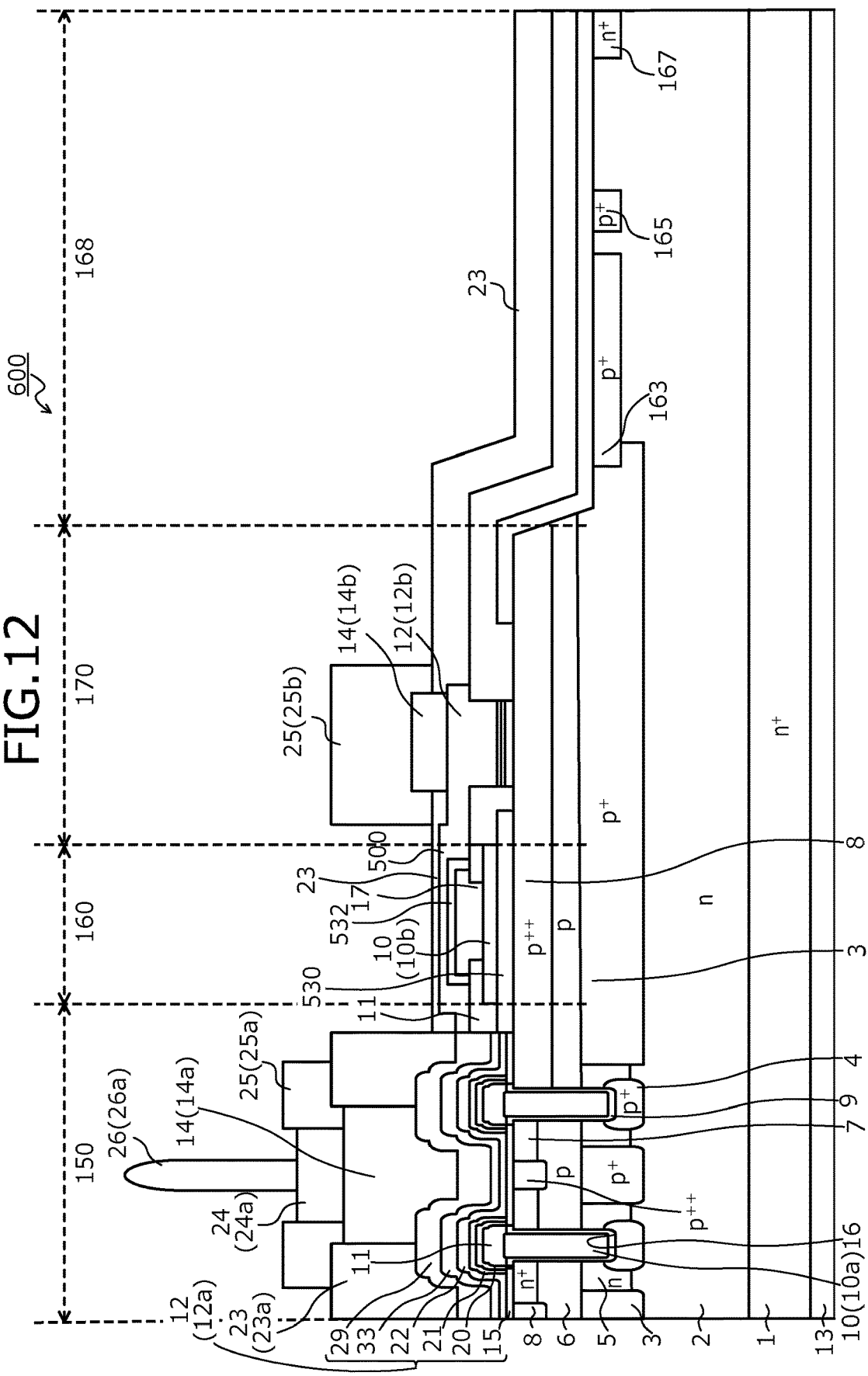
FIG. 12 is a cross-sectional view of the structure of the silicon carbide semiconductor device according to the third embodiment along cutting line A-A depicted in FIG. 11.

FIG. 12 is a cross-sectional view of the structure of the silicon carbide semiconductor device according to the third embodiment along cutting line A-A depicted in FIG. 11. As depicted in FIG. 12, in areas where the short-circuit electrodes 500 of the gate ring region 160 are disposed, a second insulating film (second insulating film) 532 is provided so as to cover the gate wiring electrode 17 and on the second insulating film 532, the short-circuit electrodes 500 are provided. The short-circuit electrodes 500 and the second gate electrode 10b are insulated from each other by the second insulating film 532.

Further, in the areas where the short-circuit electrodes 500 of the gate ring region 160 are provided, configuration may be such that the gate wiring electrode 17 is not provided and the short-circuit electrodes 500 are provided on the interlayer insulating film 11 that covers the second gate electrode 10b.

In the second embodiment described above, the gate wiring electrode 17 is divided by the short-circuit electrodes 500 and therefore, for the second gate electrode 10b near the divisions, a path to the gate electrode pad 100 may become longer. On the other hand, in the third embodiment, at least the second gate electrode 10b is not divided and therefore, a path to the gate electrode pad 100 does not become longer.

As described above, according to the third embodiment, the short-circuit electrodes that connect the first source electrode and the second source electrode are disposed without at least dividing the second gate electrode, whereby the path of the second gate electrode and the gate electrode pad may be prevented from becoming longer. Furthermore, effects similar to those of the first embodiment and the second embodiment may be obtained.

Figure 13:
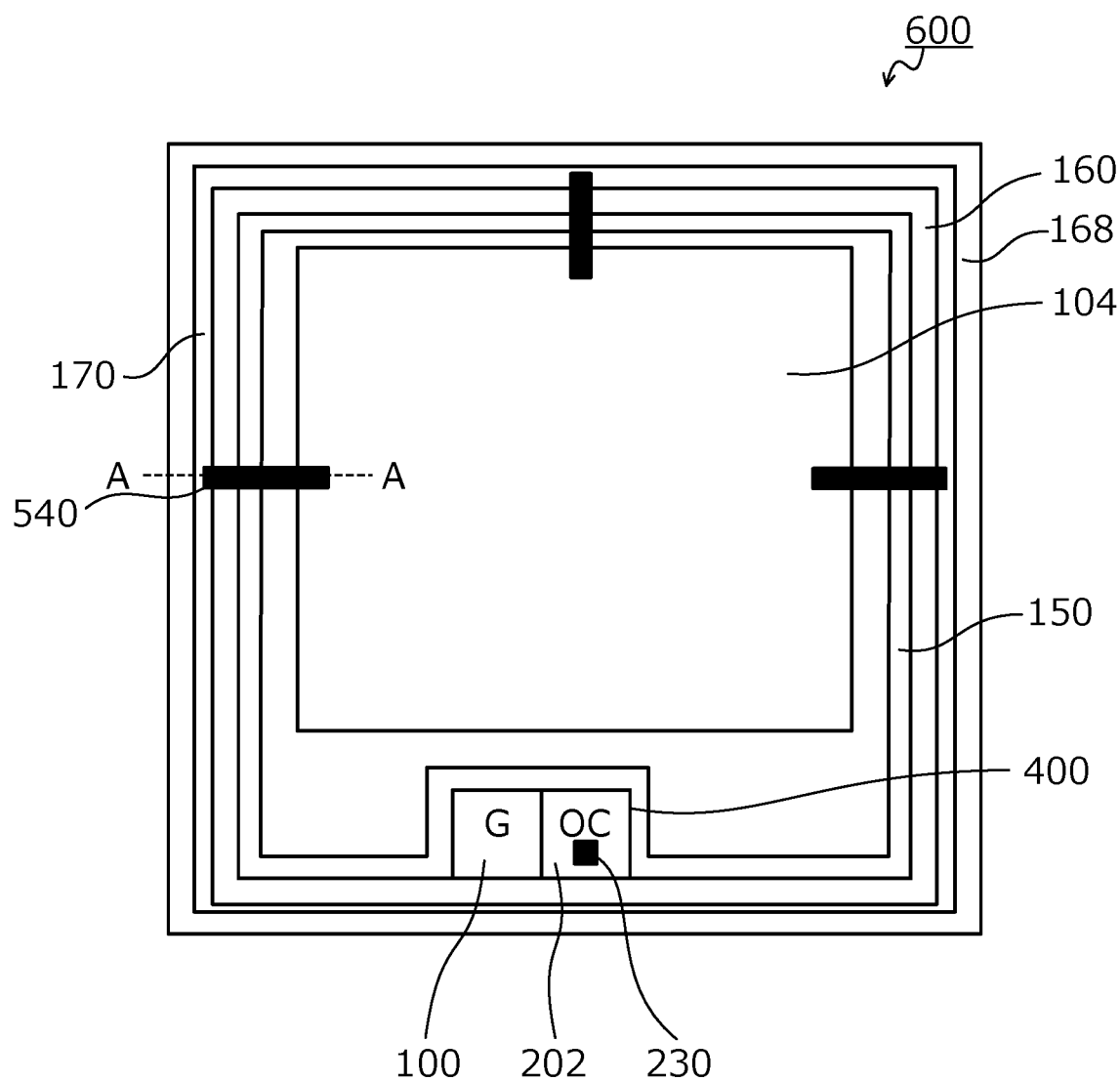
FIG. 13 is a top view of a silicon carbide semiconductor device according to a fourth embodiment.

Next, a structure of a silicon carbide semiconductor device according to a fourth embodiment will be described. FIG. 13 is a top view of the silicon carbide semiconductor device according to the fourth embodiment. The silicon carbide semiconductor device according to the fourth embodiment differs from the silicon carbide semiconductor device according to the second embodiment in that the short-circuit electrodes 500 that connect the first source electrode 12a of the active region 150 and the second source electrode 12b of the source ring region 170 are provided on the first external electrode pin 26a and a second external electrode pin 26b.

Figure 14:
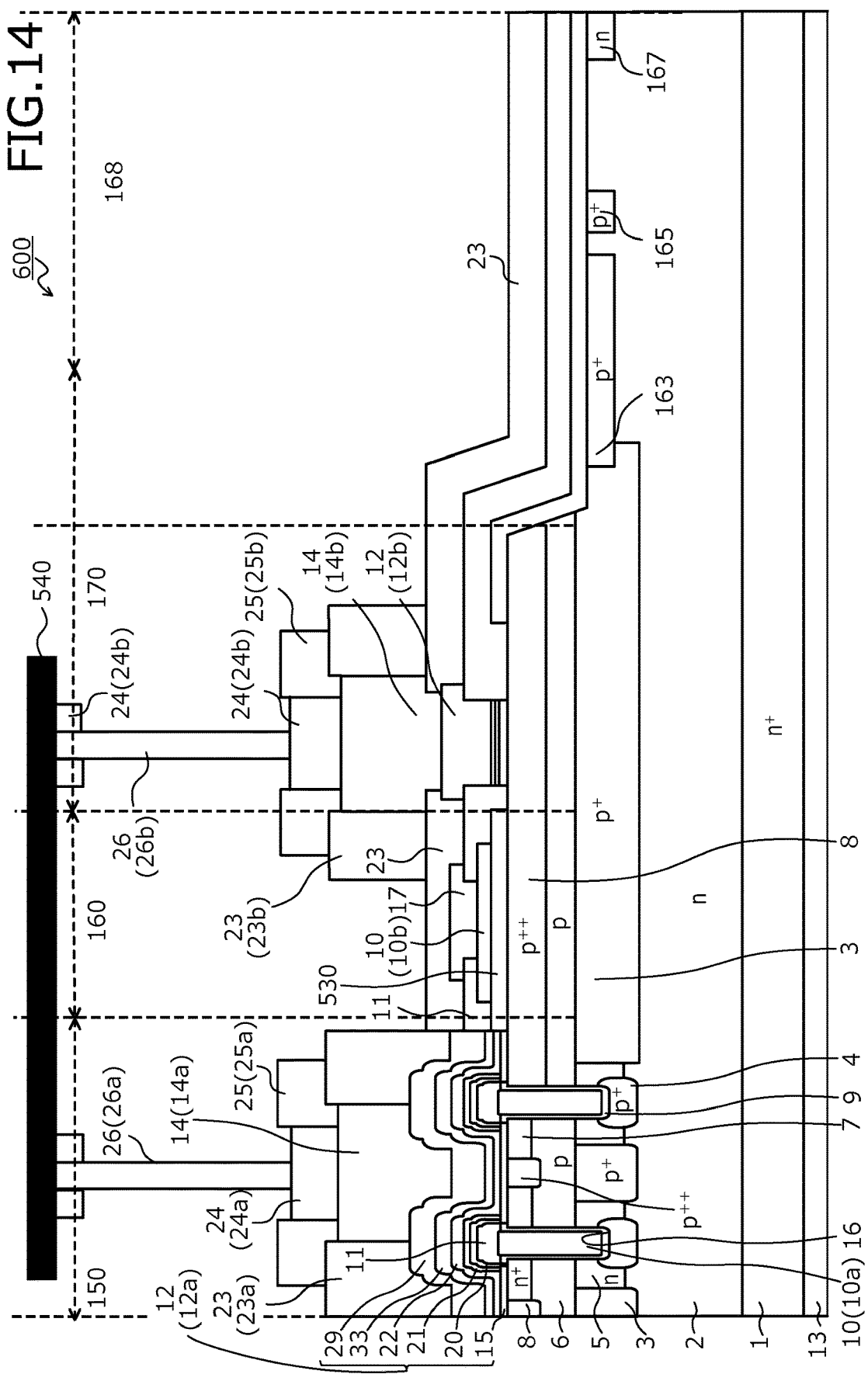
FIG. 14 is a cross-sectional view of the structure of the silicon carbide semiconductor device according to the fourth embodiment along cutting line A-A depicted in FIG. 13.

FIG. 14 is a cross-sectional view of the structure of the silicon carbide semiconductor device according to the fourth embodiment along cutting line A-A depicted in FIG. 13. As depicted in FIG. 14, in the source ring region 170, a second external electrode pin (second electrode pin) 26b is bonded on plating film (second plating film) 14, via a second solder (second solder) 24b. The second solder 24b may be surrounded by the second second-protective film 25b. The other end of the second external electrode pin 26b is connected, via the second solder 24b, to the metal bar 540 that is disposed facing the front surface of the silicon carbide semiconductor base. The metal bar 540 forms the short-circuit electrode 500. In the fourth embodiment, similarly to the third embodiment, the gate wiring electrode 17 is not divided and therefore, the path to the gate electrode pad 100 does not increase In FIG. 13, while the metal bar 540 that forms the short-circuit electrode 500 is provided at three locations, the metal bar 540 may be provided at one location.

As described above, according to the fourth embodiment, the short-circuit electrodes that connect the first source electrode and the second source electrode are provided on the first and the second external electrode pins, whereby the path the second gate electrode and the gate electrode pad may be prevented from becoming longer. Furthermore, effects similar to those of the first embodiment and the second embodiment may be obtained.

Figure 15:
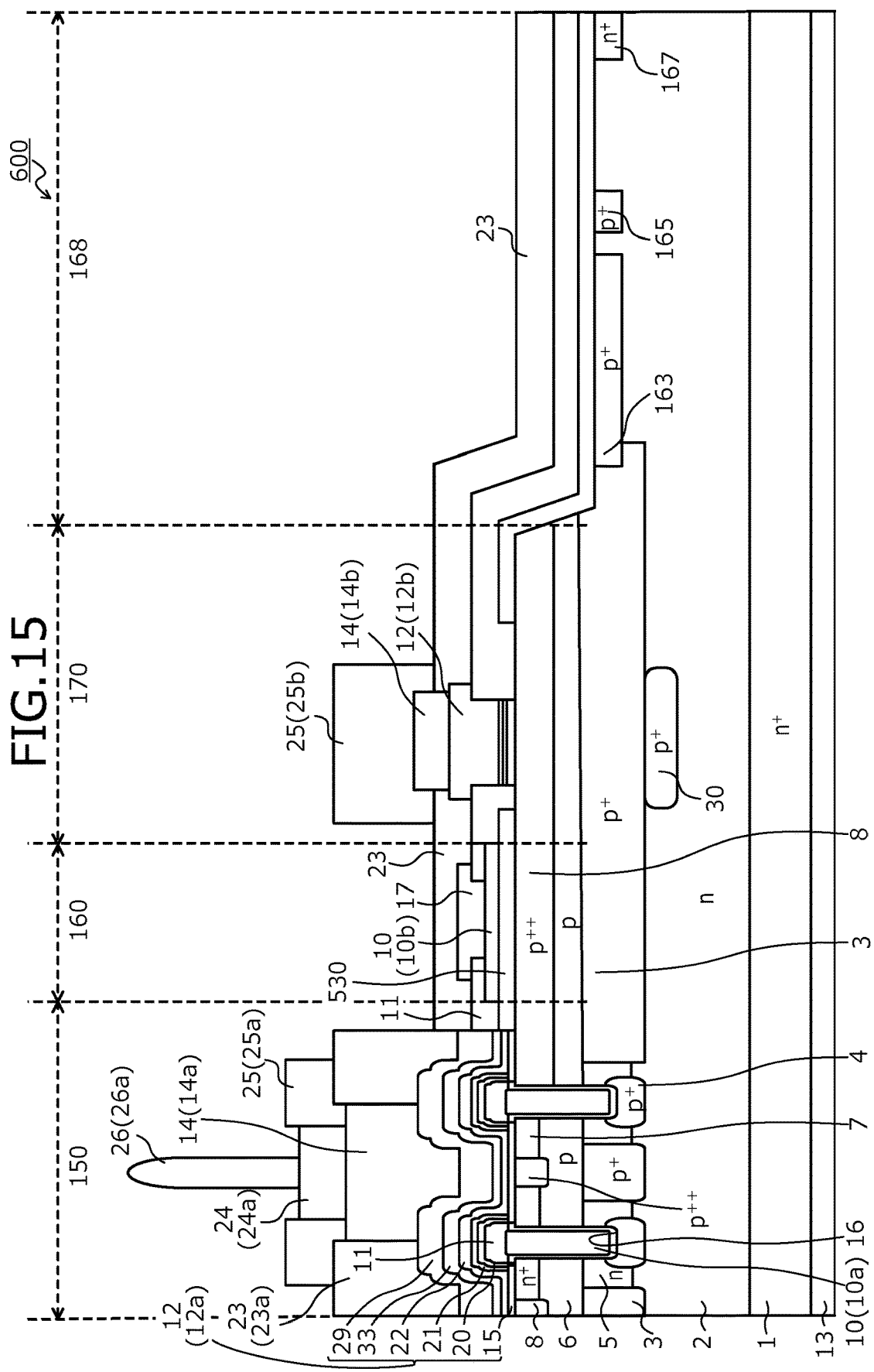
FIG. 15 is a cross-sectional view of a silicon carbide semiconductor device according to a fifth embodiment.

Next, a structure of a silicon carbide semiconductor device according to a fifth embodiment will be described. FIG. 15 is a cross-sectional view of the silicon carbide semiconductor device according to the fifth embodiment. A top view is similar to that of the first embodiment and therefore, is not depicted. The silicon carbide semiconductor device according to the fifth embodiment differs from the silicon carbide semiconductor devices according to the first to the fourth embodiments in that in the n-type silicon carbide epitaxial layer 2 of the source ring region 170, the first $p^+$-type base region 3 is formed deeply at a position facing the second source electrode 12b in the depth direction. This deeply formed part is referred to as a $p^+$-type region (second semiconductor region of the second conductivity type) 30.

As depicted in FIG. 15, the $p^+$-type region 30 is provided in a ring-shape in a surface layer of the n-type silicon carbide epitaxial layer 2 in the source ring region 170 and may have a width wider than a width of the second source electrode 12b; and at least, may be wider than a width of the contact holes in the interlayer insulating film 11. The $p^+$-type region 30 is the part where the first $p^+$-type base region 3 is formed deeply and therefore, has an impurity concentration about equal to that of the first $p^+$-type base regions 3. Further, configuration may be such that the $p^+$-type region 30 does not reach the $n^+$-type silicon carbide substrate 1 in the depth direction.

By providing the $p^+$-type region 30, the hole current that flows into the active region 150 from the edge termination region 168 during the OFF state flows to the $p^+$-type region 30 having a resistance lower than that of the n-type silicon carbide epitaxial layer 2, thereby further facilitating extraction of the hole current to the second source electrode 12b and enabling further mitigation of current concentration at the active region 150.

Figure 16:
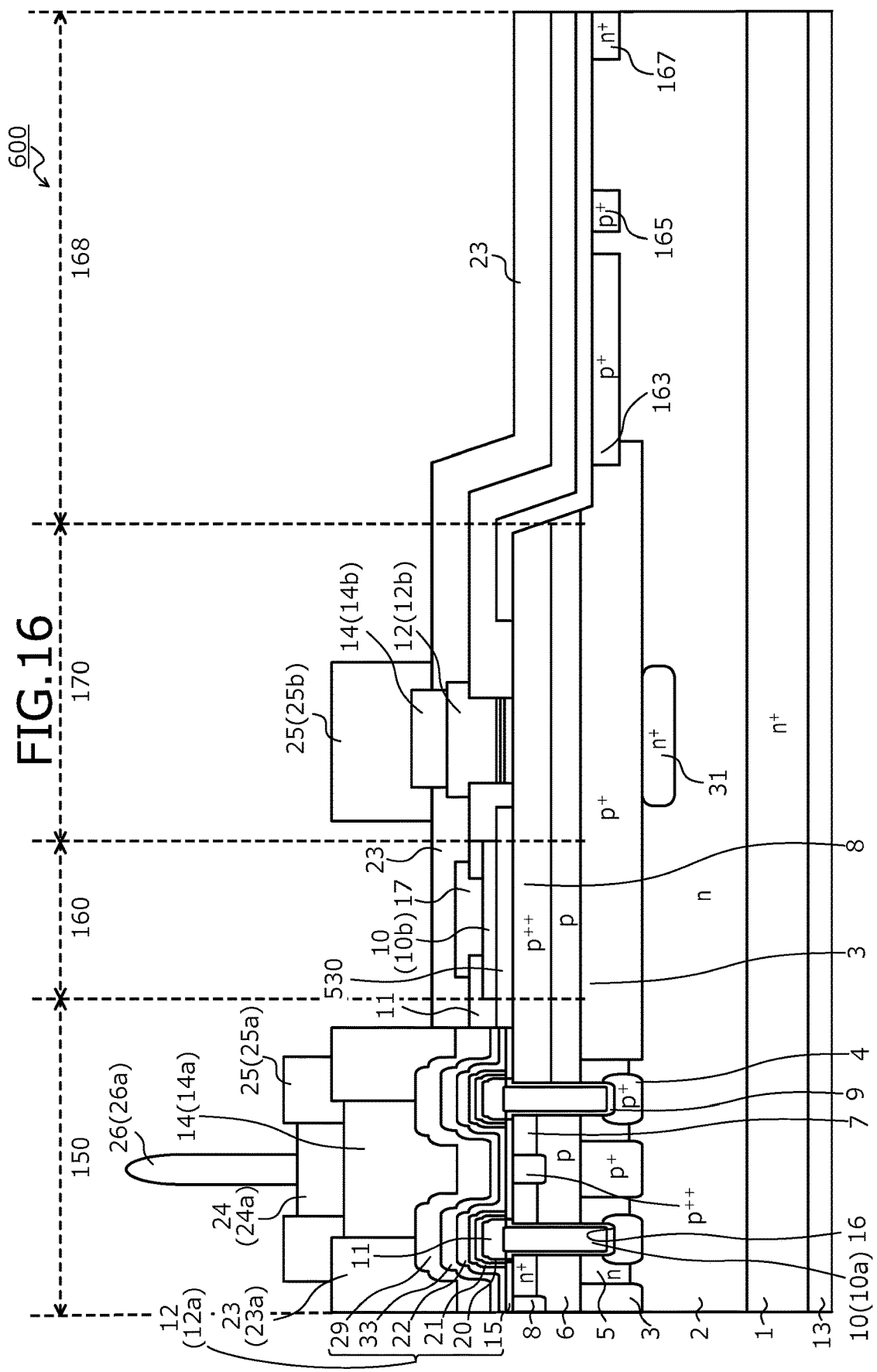
FIG. 16 is another cross-sectional view of a structure of the silicon carbide semiconductor device according to the fifth embodiment.

FIG. 16 is another cross-sectional view of a structure of the silicon carbide semiconductor device according to the fifth embodiment. As depicted in FIG. 16, instead of the $p^+$-type region 30, an $n^+$-type region (second semiconductor region of the first conductivity type) 31 may be provided. Similarly to the $p^+$-type region 30, to facilitate the flow of the hole current to the $n^+$-type region 31, the $n^+$-type region 31 has an impurity concentration that is higher than the impurity concentration of the n-type silicon carbide epitaxial layer 2. Further, the $n^+$-type region 31 suffices to have a depth and a width that are equal to those of the $p^+$-type region 30. Further, when the impurity concentration of the $n^+$-type region 31 is higher than the impurity concentration of the n-type silicon carbide epitaxial layer 2, the hole current passes through an upper part of the $n^+$-type region 31 and easily flows to the second source electrode 12b and therefore, the impurity concentration of the $n^+$-type region 31 is set to a higher concentration than the impurity concentration of the n-type silicon carbide epitaxial layer 2.

Figure 17:
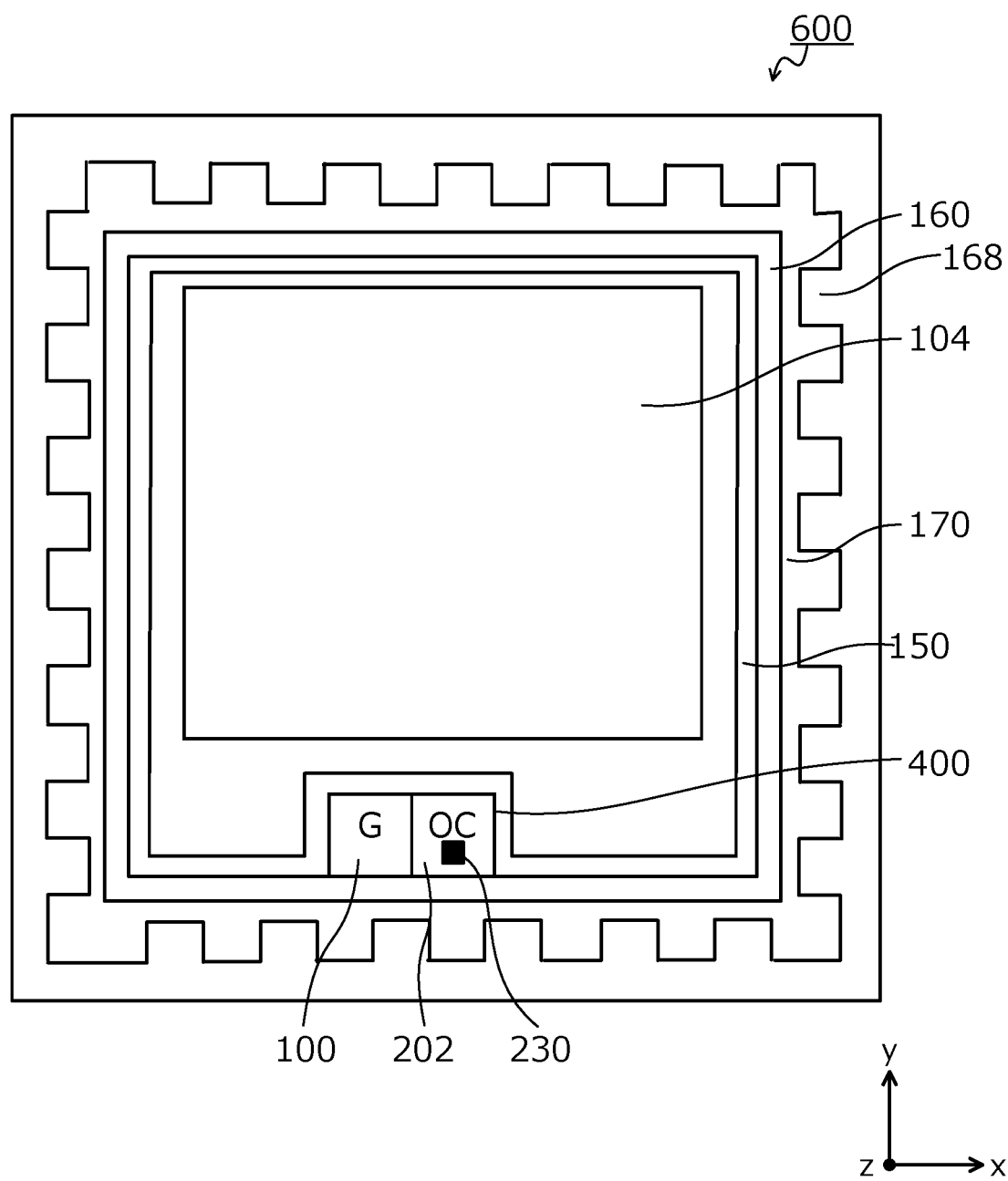
FIG. 17 is a plan view of another structure of the silicon carbide semiconductor device according to the fifth embodiment.

FIG. 17 is a plan view of another structure of the silicon carbide semiconductor device according to the fifth embodiment. In this example, while the $p^+$-type region 30, the second source electrode 12b, and the second plating film 14b have a quadrilateral shape in a plan view similarly to that in FIG. 15, unlike that in FIG. 15, corner parts are intentionally provided along side parts as well. In particular, in FIG. 17, the $p^+$-type region 30, the second source electrode 12b, and the second plating film 14b have a shape including protruding and concave parts. In this manner, the $p^+$-type region 30, the second source electrode 12b, and the second plating film 14b have a closed loop shape having corner parts, whereby a width of the $p^+$-type region 30 in a diameter direction thereof increases and electric field concentrates at the corner parts of the $p^+$-type region 30, obtaining an effect in that extraction of the hole current is facilitated. Further, similar effects are obtained even when the second source electrode 12b and the second plating film 14b have linear shapes similarly to those depicted in FIG. 15 and only the p$^+$-type region 30 has the shape that includes protruding and concave parts. The p$^+$-type region 30 suffices to have the closed loop shape that includes corner parts at linear side parts and various types of shapes are possible. For example, other than protruding and concave parts, the shape may be zig-zagged. Further, the p$^+$-type region 30 may be changed to the n$^+$-type region 31.

Further, in the silicon carbide semiconductor device according to the fifth embodiment, while a configuration is depicted in which the first source electrode 12a and the second source electrode 12b of the first embodiment are not electrically connected by the short-circuit electrodes 500, similarly to the second embodiment, the short-circuit electrodes 500 may be provided. In this case, a top view is similar to that depicted in FIG. 9. Further, similarly to the third embodiment, the short-circuit electrodes 500 may be provided without the dividing regions 550. In this case, a top view is similar to that depicted in FIG. 11. Further, similarly to the fourth embodiment, the metal bars 540 (short-circuit electrodes) may be provided on the first and the second first external electrode pins 26a, 26b. In this case, a top view is similar to that in FIG. 13.

As described above, according to the fifth embodiment, the p$^+$-type base region is formed deeply at a position facing the second source electrode in the depth direction and the p$^+$-type region is provided. Alternatively, the n$^+$-type region is provided at the position of the p$^+$-type region. Hole current flows in the p$^+$-type region or the n$^+$-type region and extraction of the hole current to the second source electrode is further facilitated, thereby enabling current concentration at ends of the active region to be further mitigated. Furthermore, effects similar to those of the first embodiment may be obtained. Further, by providing short-circuit electrodes equivalent to those of the second to the fourth embodiments, effects similar to those of the second to the fourth embodiments may be obtained.

Figure 18:
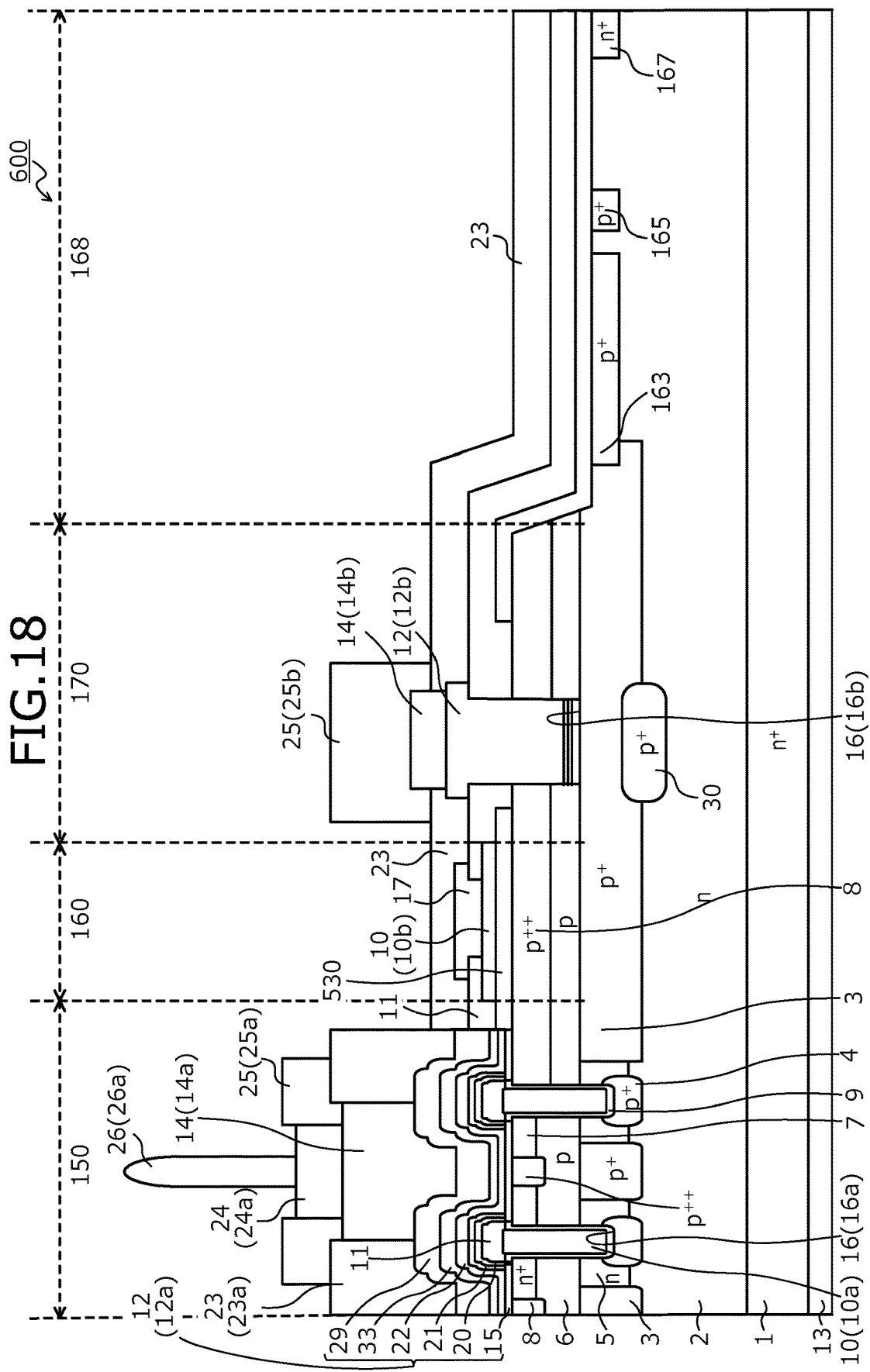
FIG. 18 is a cross-sectional view of a structure of the silicon carbide semiconductor device according to a sixth embodiment.

Next, a structure of a silicon carbide semiconductor device according to a sixth embodiment will be described. FIG. 18 is a cross-sectional view of the structure of the silicon carbide semiconductor device according to the sixth embodiment. A top view is similar to that of the first embodiment and therefore is not depicted. The silicon carbide semiconductor device according to the sixth embodiment differs from the silicon carbide semiconductor device according to the fifth embodiment in that the second source electrode 12b of the source ring region 170 is provided in a trench 16. Hereinafter, the trenches 16 of the active region 150 are referred to as first trenches (first trenches) 16a and the trench 16 of the source ring region 170 is referred to as a second trench (second trench) 16b.

As depicted in FIG. 18, the second trench 16b penetrates through the interlayer insulating film 11, the p$^{++}$-type contact regions 8, and the p-type base layer 6, and reaches the first p$^+$-type base region 3. In the second trench 16b, the second source electrode 12b is embedded. The second source electrode 12b, similarly to the first embodiment, is a multilayered film in which the NiSi electrodes 15, the first TiN film 20, the first Ti film 21, the second TiN film 22, the second Ti film 33, and the Al alloy film 29 are stacked. A part of the second source electrode 12b protrudes from a top of the second trench 16b, toward the second second-protective film 25b.

The second plating film 14b is provided at the surface of the second source electrode 12b. A part of the surface of the second source electrode 12b other than that of the second plating film 14b is covered by the first protective film 23. In particular, the first protective film 23 is provided so as to cover the second source electrode 12b and in an opening of the first protective film 23, the second plating film 14b is provided. The second plating film 14b may be surrounded by the second second-protective film 25b. The second plating film 14b may be provided at an entire surface of the second source electrode 12b or may be provided selectively, for example, only at parts of the second source electrode 12b at corner parts of the source ring region 170. Further, the width of the second source electrode 12b in the sixth embodiment may be about equal to the width of the second source electrode 12b in the first to the fifth embodiments.

Further, the p$^+$-type region 30 may be provided at the bottom of the second trench 16b. The p$^+$-type region 30, similarly to the second p$^+$-type base regions 4, protects the second trench 16b and, similarly to the p$^+$-type region 30 of the fifth embodiment, facilitates extraction of hole current to the second source electrode 12b. In this manner, by providing the second source electrode 12b in the second trench 16b, the mathematical area of contact with p-type regions (the p$^{++}$-type contact regions 8, the first p$^+$-type base regions 3, and the p-type base layer 6) increases, enabling contact resistance to be reduced.

Figure 19:
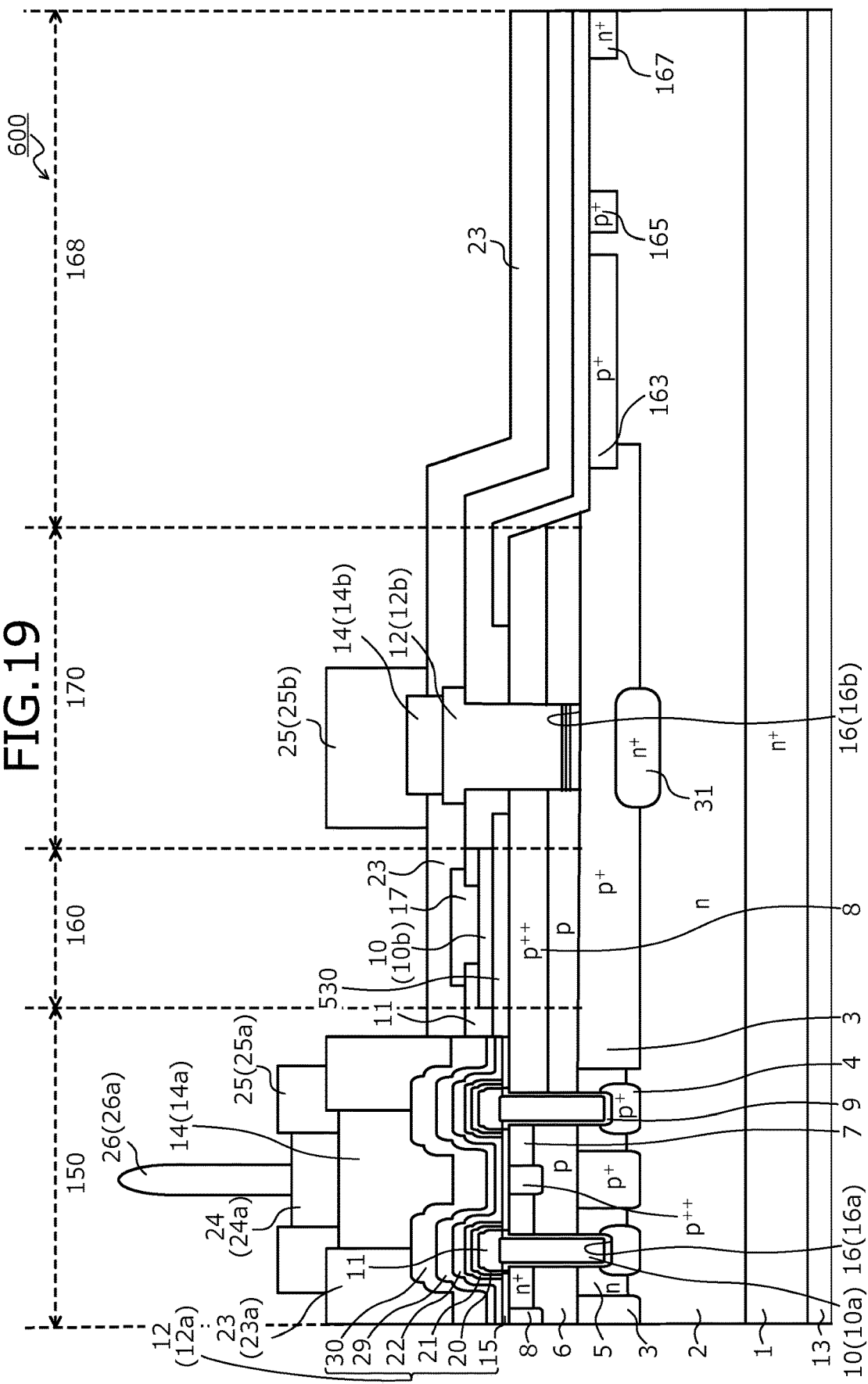
FIG. 19 is another cross-sectional view of a structure of the silicon carbide semiconductor device according to the sixth embodiment.

FIG. 19 is another cross-sectional view of a structure of the silicon carbide semiconductor device according to the sixth embodiment. As depicted in FIG. 19, instead of the p$^+$-type region 30, the n$^+$-type region 31 may be provided. Similarly to the p$^+$-type region 30, to facilitate the flow of hole current to the n$^+$-type region 31, for example, the impurity concentration of the n$^+$-type region 31 is higher than the impurity concentration of the n-type silicon carbide epitaxial layer 2. Further, the depth and the width of the n$^+$-type region 31 suffice to be equal to those of the p$^+$-type region 30.

Further, in the silicon carbide semiconductor device according to the sixth embodiment, while the first source electrode 12a and the second source electrode 12b of the first embodiment are depicted to not be connected by the short-circuit electrodes 500, similarly to the second embodiment, the short-circuit electrodes 500 may be provided. In this case, a top view is similar to that depicted in FIG. 9. Further, similarly to the third embodiment, the short-circuit electrodes 500 may be provided without providing the dividing regions 550. In this case, a top view is similar to that depicted in FIG. 11. Further, similarly to the fourth embodiment, the metal bars 540 (short-circuit electrodes) may be provided on the first and the second first external electrode pins 26a, 26b. In this case, a top view is similar to that depicted in FIG. 13.

As described above, according to the sixth embodiment, the second source electrode is provided in the second trench, thereby increasing the mathematical area of contact with the p-type regions and enabling reduction of the contact resistance. Further, the p$^+$-type region or the n$^+$-type region is provided at the bottom of the second trench. The hole current flows to the p$^+$-type region or the n$^+$-type region and extraction of the hole current from the second source electrode is further facilitated, enabling further mitigation of current concentration at ends of the active region. Furthermore, effects similar to those of the first embodiment may be obtained. Further, by providing short-circuit electrodes equivalent to those of the second to the fourth embodiments, effects similar to those of the second to the fourth embodiments may be obtained.

Figure 20:
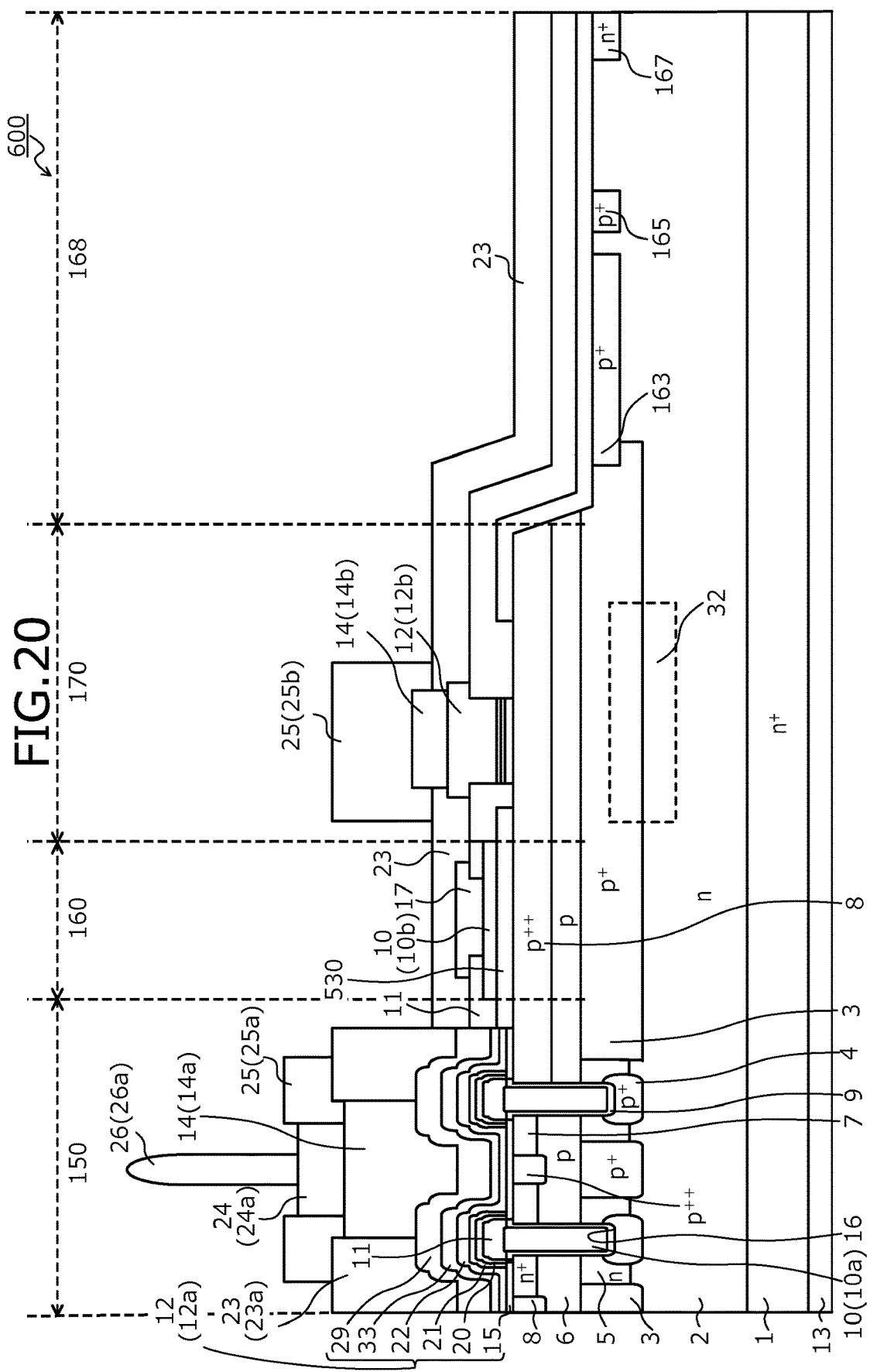
FIG. 20 is a cross-sectional view of a structure of a silicon carbide semiconductor device according to a seventh embodiment.

Next, a structure of a silicon carbide semiconductor device according to a seventh embodiment will be described. FIG. 20 is a cross-sectional view of the structure of the silicon carbide semiconductor device according to the seventh embodiment. A top view is similar to that of the first embodiment and therefore, is not depicted. The silicon carbide semiconductor device according to the seventh embodiment differs from the silicon carbide semiconductor devices according to the first to the fourth embodiments in that at an interface between the n-type silicon carbide epitaxial layer 2 and the first p$^+$-type base region 3 of the source ring region 170, a lifetime killer region 32 is provided at a position facing the second source electrode 12*b* in the depth direction.

As depicted in FIG. 20, the lifetime killer region 32 is provided at the interface between the n-type silicon carbide epitaxial layer 2 and the first p$^+$-type base region 3 of the source ring region 170. In other words, a first surface of the lifetime killer region 32 facing the second source electrode 12*b* is provided in the first p$^+$-type base region 3 and a second surface of the lifetime killer region 32 facing the drain electrode (the back electrode 13) is provided in the n-type silicon carbide epitaxial layer 2. The second surface of the lifetime killer region 32 facing the drain electrode (the back electrode 13) may reach the n$^+$-type silicon carbide substrate 1. The lifetime killer region 32 may be wider than the width of the second source electrode 12*b* and at least, may be wider than the width of the contact holes in the interlayer insulating film 11.

The lifetime killer region 32, for example, is a region in which crystal structure damage is provided by irradiation of an electron beam or protons (H$^+$), helium (He), platinum (Pt), etc. Provision of the lifetime killer region 32 enables shortening of carrier lifetime in the source ring region 170, reduction of the hole current that flows from the edge termination region 168 to the active region 150, and further mitigation of current concentration at the active region 150. Further, configuration may be such that both the lifetime killer region 32 and the p$^+$-type region 30 are provided or both the lifetime killer region 32 and the n$^+$-type region 31 are provided.

Further, in the silicon carbide semiconductor device according to the seventh embodiment, while a configuration in which the first source electrode 12*a* and the second source electrode 12*b* of the first embodiment are not electrically connected to the short-circuit electrodes 500 is depicted, similarly to the second embodiment, the short-circuit electrodes 500 may be provided. In this case, a top view is similar to that depicted in FIG. 9. Further, similarly to the third embodiment, the short-circuit electrodes 500 may be provided without providing the dividing regions 550. In this case, a top view is similar to that depicted in FIG. 11. Further, similarly to the fourth embodiment, the metal bars 540 (short-circuit electrodes) may be provided on the first and the second first external electrode pins 26*a*, 26*b*. In this case, a top view is similar to that depicted in FIG. 13.

As described above, according to the seventh embodiment, the lifetime killer region is provided at a region facing the second source electrode in the depth direction. Provision of the lifetime killer region enables shortening of the carrier lifetime in the source ring region, reduction of the hole current that flows from the edge termination region to the active region, and further mitigation of current concentration at ends of the active region. Furthermore, effects similar to those of the first embodiment may be obtained. Further, by providing short-circuit electrodes equivalent to those in the second to the fourth embodiment, effects similar to those of the second to fourth embodiments may be obtained.

Figure 21:
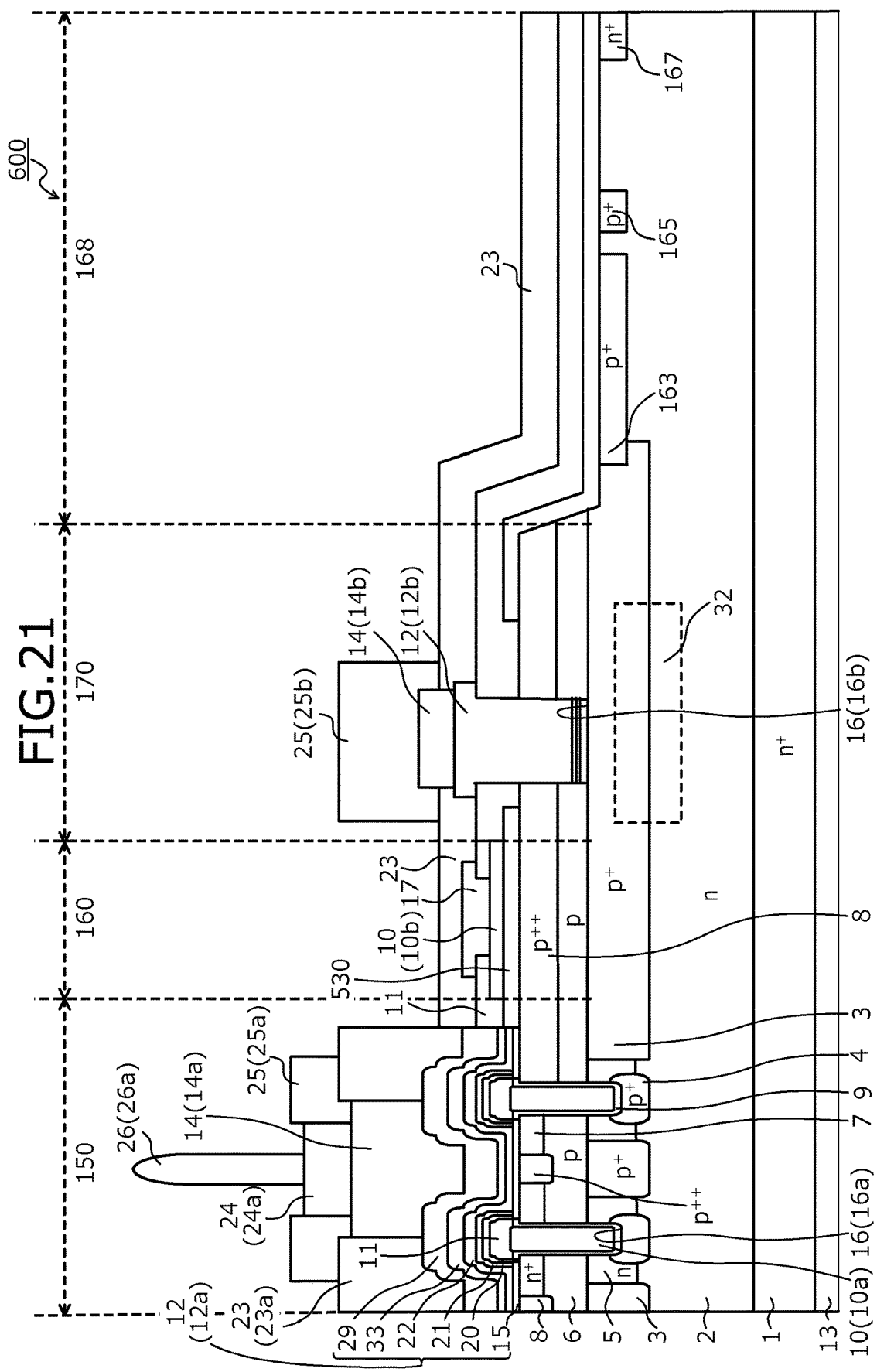
FIG. 21 is a cross-sectional view of a structure of a silicon carbide semiconductor device according to an eighth embodiment.
Figure 22:
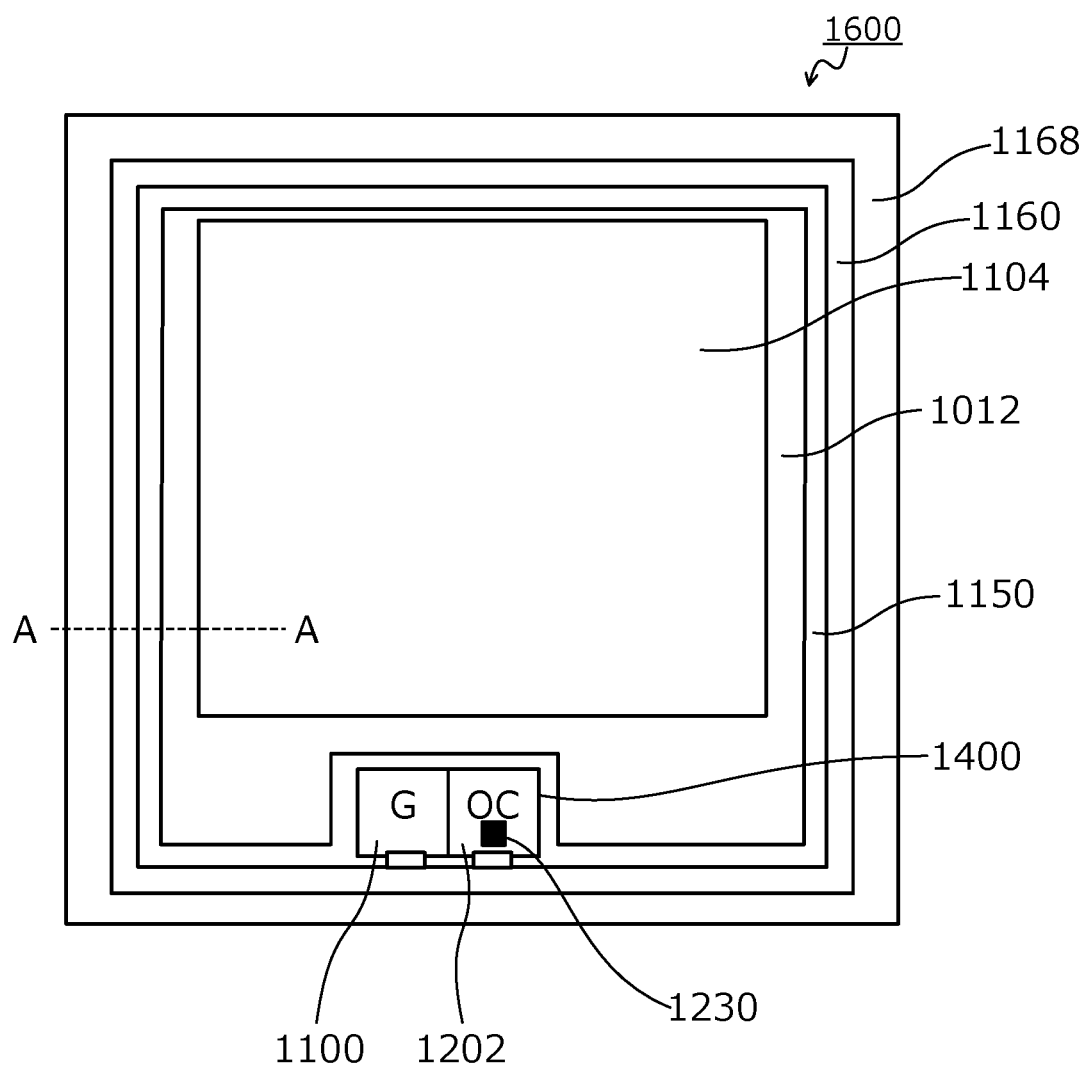
FIG. 22 is a top view of a structure of a conventional silicon carbide semiconductor device.

Next, a structure of a silicon carbide semiconductor device according to an eighth embodiment will be described. FIG. 21 is a cross-sectional view of the structure of the silicon carbide semiconductor device according to the eighth embodiment. A top view is similar to that of the first embodiment and therefore, is not depicted. The silicon carbide semiconductor device according to the eighth embodiment differs from the silicon carbide semiconductor device according to the seventh embodiment in that the second source electrode 12*b* of the source ring region 170 is provided in the second trench 16*b*.

As depicted in FIG. 21, the second trench 16*b* penetrates through the interlayer insulating film 11, the p$^{++}$-type contact regions 8, and the p-type base layer 6, and reaches the first p$^+$-type base region 3. The second source electrode 12*b* is embedded in the second trench 16*b*. The second source electrode 12*b*, similarly to the first embodiment, is a multilayered film in which the NiSi electrodes 15, the first TiN film 20, the first Ti film 21, the second TiN film 22, the second Ti film 33, and the Al alloy film 29 are stacked. A part of the second source electrode 12*b* protrudes from the top of the second trench 16*b*, toward the second second-protective film 25*b*.

The second plating film 14*b* is provided at the surface of the second source electrode 12*b*. A part of the surface of the second source electrode 12*b* other than that of the second plating film 14*b* is covered by the first protective film 23. In particular, the first protective film 23 is provided so as to cover the second source electrode 12*b* and in an opening of the first protective film 23, the second plating film 14*b* is provided. The second plating film 14*b* may be surrounded by the second second-protective film 25*b*. The second plating film 14*b* may be provided at an entire surface of the second source electrode 12*b* or may be provided selectively, for example, only at parts of the second source electrode 12*b* at corner parts of the source ring region 170. Further, the width of the second source electrode 12*b* in the eighth embodiment may be about equal to the width of the second source electrode 12*b* in the first to the fourth embodiments.

As depicted in FIG. 21, the lifetime killer region 32 is provided at the interface between the n-type silicon carbide epitaxial layer 2 and the first p$^+$-type base region 3 of the source ring region 170. In other words, the first surface of the lifetime killer region 32 facing the second source electrode 12*b* is provided in the first p$^+$-type base region 3 and the second surface of the lifetime killer region 32 facing the drain electrode (the back electrode 13) is provided in the n-type silicon carbide epitaxial layer 2. The second surface of the lifetime killer region 32 facing the drain electrode (the back electrode 13) may reach the n$^+$-type silicon carbide substrate 1. The lifetime killer region 32 may be wider than the width of the second trench 16*b*.

The lifetime killer region 32, for example, is a region in which crystal structure damage is provided by irradiation of an electron beam or protons (H$^+$), helium (He), platinum (Pt), etc. Provision of the lifetime killer region 32 enables shortening of carrier lifetime in the source ring region 170, reduction of the hole current that flows from the edge termination region 168 to the active region 150, and further mitigation of current concentration at the active region 150.

Further, in the silicon carbide semiconductor device according to the eighth embodiment, while a configuration in which the first source electrode 12*a* and the second source electrode 12*b* of the first embodiment are not electrically connected to the short-circuit electrodes 500 is depicted, similarly to the second embodiment, the short-circuit electrodes 500 may be provided. In this case, a top view is similar to that depicted in FIG. 9. Further, similarly to the third embodiment, the short-circuit electrodes 500 may be provided without providing the dividing regions 550. In this case, a top view is similar to that depicted in FIG. 11. Further, similarly to the fourth embodiment, the metal bars 540 (short-circuit electrodes) may be provided on the first and the second first external electrode pins 26a, 26b. In this case, a top view is similar to that depicted in FIG. 13.

As described above, according to the eighth embodiment, the second source electrode is provided in the second trench, whereby the mathematical area of contact with the p-type regions increases, enabling contact resistance to be reduced. Further, the lifetime killer region is provided at the bottom of the second trench. Provision of the lifetime killer region enables shortening of the carrier lifetime in the source ring region, reduction of the hole current that flows from the edge termination region to the active region, and further mitigation of current concentration at ends of the active region. Furthermore, effects similar to those of the first embodiment may be obtained. Further, by providing short-circuit electrodes equivalent to those in the second to the fourth embodiment, effects similar to those of the second to fourth embodiments may be obtained.

In the foregoing, various modifications within a range not departing from the spirit of the invention are possible and, for example, in the embodiments above, dimensions, impurity concentrations, etc. of parts may be variously set according to required specifications. Further, in the embodiments described above, while a case in which silicon carbide is used as a wide bandgap semiconductor is described as an example, a wide bandgap semiconductor other than silicon carbide, such as, for example, gallium nitride (GaN) may be applied. Further, in the embodiments, while the first conductivity type is an n-type and the second conductivity type is a p-type, the present invention is similarly implemented when the first conductivity type is a p-type and the second conductivity type is an n-type.

According to the invention described above, between the gate ring region and the edge termination region, the source ring region is provided so as to surround the gate ring region. In the source ring region, the second source electrode is provided and the source ring region has a function of extracting, via the p-type base layer, the hole current that flows into the active region from the edge termination region when the main semiconductor element is OFF. Therefore, current concentration at ends of the active region may be mitigated by the source ring region. Further, the plating film is provided on the second source electrode of the source ring region, whereby the resistance of the second source electrode is reduced, enabling the breakdown tolerance of the second source electrode to be improved.

The semiconductor device according to the invention achieves an effect in that destruction in the edge termination region may be suppressed.

As described, the semiconductor device according to the present invention is useful for power semiconductor devices used in power converting equipment such as inverters, power supply devices such as in various types of industrial machines, and inverters for automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device having
an active region through which a main current flows,
a gate ring region surrounding a periphery of the active region,
a ring region surrounding a periphery of the gate ring region, and
a termination region surrounding a periphery of the ring region,
the semiconductor device comprising:
a semiconductor substrate of a first conductivity type, the semiconductor substrate having a front surface and a back surface opposite to each other;
a first semiconductor layer of the first conductivity type, provided at the front surface of the semiconductor substrate and having an impurity concentration lower than an impurity concentration of the semiconductor substrate, the first semiconductor layer having a first side and a second side opposite to each other, the second side facing the semiconductor substrate;
a second semiconductor layer of a second conductivity type, provided at a surface of the first semiconductor layer at the first side thereof, the second semiconductor layer having a first side and a second side opposite to each other, the second side of the second semiconductor layer facing the first semiconductor layer;
in the active region,
a plurality of first semiconductor regions of the first conductivity type, selectively provided in a surface layer of the second semiconductor layer at the first side thereof,
a gate insulating film having a first side and a second side opposite to each other, a surface thereof at the second side being in contact with the second semiconductor layer,
a plurality of first gate electrodes provided at a surface of the gate insulating film at the first side thereof,
an interlayer insulating film provided on the plurality of first gate electrodes,
a first first-electrode provided at a surface of the second semiconductor layer and surfaces of the plurality of first semiconductor regions, and
a first plating film selectively provided on the first first-electrode, and partially covering the first first-electrode in a depth direction of the semiconductor device;
in the gate ring region,
a first insulating film having a first side and a second side opposite to each other, a surface thereof at the second side being in contact with the second semiconductor layer, and
a second gate electrode provided at a surface of the first insulating film at the first side thereof, and
a gate wiring electrode provided on the second gate electrode;
in the ring region,
a second first-electrode provided at the surface of the second semiconductor layer and having an electric potential equal to that of the first first-electrode, the second first-electrode having a stacked structure that includes:
a NiSi layer provided on the surface of the second semiconductor layer,
a barrier metal provided on a surface of the NiSi layer, and
a film including Al provided on the barrier metal,
the barrier metal including a stack of four layers that respectively are, from the surface of the NiSi layer to the film including Al, a first TiN film, a first Ti film, a second TiN film, and a second Ti film, the second Ti film being in direct contact with the film including Al, and
a second plating film provided on the second first-electrode, and partially covering the second first-electrode in the depth direction of the semiconductor device; and
a second electrode provided at the back surface of the semiconductor substrate, wherein in a plan view of the semiconductor device,
the gate wiring electrode in the gate ring region forms a closed loop to fully surround the first first-electrode in the active region, and
the second first-electrode in the ring region forms another closed loop to fully surround the gate wiring electrode in the gate ring region;
the electric potential of the second first-electrode is fixed to that of the first first-electrode via the second semiconductor layer; and
the second plating film is spaced apart from the first plating film.

2. The semiconductor device according to claim 1, further comprising, in the active region, a plurality of trenches each penetrating one of the plurality of first semiconductor regions, penetrating the second semiconductor layer, and reaching the first semiconductor layer, wherein
the plurality of first gate electrodes are respectively provided in the plurality of trenches via the gate insulating film.

3. The semiconductor device according to claim 1, further comprising
a second insulating film partially provided on the gate wiring electrode; and
a short-circuit electrode provided on the second insulating film, and electrically connecting the first first-electrode and the second first-electrode.

4. The semiconductor device according to claim 1, wherein
a mathematical area of a part where the second first-electrode is in contact with the surface of the second semiconductor layer is at least two times greater than a mathematical area of a part where the first first-electrode is in contact with the surface of the second semiconductor layer and the surfaces of the plurality of first semiconductor regions.

5. The semiconductor device according to claim 1, wherein
the active region has a rectangular shape, and
the second first-electrode has a width that is greater at a corner part of the ring region surrounding the periphery of the gate ring region and the active region, than at other parts of the ring region.

6. The semiconductor device according to claim 1, wherein
the ring region forms a closed loop in the plan view of the semiconductor device.

7. The semiconductor device according to claim 1, wherein
the second gate electrode is insulated from the second semiconductor layer by the first insulating film.

8. The semiconductor device according to claim 1, wherein
the first first-electrode having another stacked structure that includes:
another NiSi layer, provided on the surface of the second semiconductor layer and on surfaces of the plurality of first semiconductor regions,
another barrier metal provided on a surface of said another NiSi layer, and
another film including Al provided on said another barrier metal,
said another barrier metal including a stack of four layers that respectively are, from the surface of said another NiSi layer to said another film including Al, another first TiN film, another first Ti film, another second TiN film, and another second Ti film.

9. The semiconductor device according to claim 1, further comprising:
a second semiconductor region of the second conductivity type provided in the second semiconductor layer, the second semiconductor region having an impurity concentration higher than an impurity concentration of the second semiconductor layer, wherein
the second semiconductor region is provided from below the first first-electrode to below the second first-electrode.

10. A semiconductor device having
an active region through which a main current flows,
a gate ring region surrounding a periphery of the active region,
a ring region surrounding a periphery of the gate ring region, and
a termination region surrounding a periphery of the ring region,
the semiconductor device comprising:
a semiconductor substrate of a first conductivity type, the semiconductor substrate having a front surface and a back surface opposite to each other;
a first semiconductor layer of the first conductivity type, provided at the front surface of the semiconductor substrate and having an impurity concentration lower than an impurity concentration of the semiconductor substrate, the first semiconductor layer having a first side and a second side opposite to each other, the second side facing the semiconductor substrate;
a second semiconductor layer of a second conductivity type, provided at a surface of the first semiconductor layer at the first side thereof, the second semiconductor layer having a first side and a second side opposite to each other, the second side of the second semiconductor layer facing the first semiconductor layer;
in the active region,
a plurality of first semiconductor regions of the first conductivity type, selectively provided in a surface layer of the second semiconductor layer at the first side thereof,
a gate insulating film having a first side and a second side opposite to each other, a surface thereof at the second side being in contact with the second semiconductor layer,
a plurality of first gate electrodes provided at a surface of the gate insulating film at the first side thereof,
an interlayer insulating film provided on the plurality of first gate electrodes,
a first first-electrode provided at a surface of the second semiconductor layer and surfaces of the plurality of first semiconductor regions, and
a first plating film selectively provided on the first first-electrode;
in the gate ring region,
a first insulating film having a first side and a second side opposite to each other, a surface thereof at the second side being in contact with the second semiconductor layer, and a second gate electrode provided at a surface of the first insulating film at the first side thereof, and
a gate wiring electrode provided on the second gate electrode;
in the ring region,
a second first-electrode provided at the surface of the second semiconductor layer and having an electric potential equal to that of the first first-electrode, the second first-electrode including Al, and
a second plating film provided on the second first-electrode;
a second electrode provided at the back surface of the semiconductor substrate;
a first solder provided on the first plating film;
a first electrode pin provided on the first solder;
a second solder provided on the second plating film;
a second electrode pin provided on the second solder; and
a short-circuit electrode electrically connecting the first electrode pin and the second electrode pin.

11. A semiconductor device having
an active region through which a main current flows,
a gate ring region surrounding a periphery of the active region,
a ring region surrounding a periphery of the gate ring region, and
a termination region surrounding a periphery of the ring region,
the semiconductor device comprising:
a semiconductor substrate of a first conductivity type, the semiconductor substrate having a front surface and a back surface opposite to each other;
a first semiconductor layer of the first conductivity type, provided at the front surface of the semiconductor substrate and having an impurity concentration lower than an impurity concentration of the semiconductor substrate, the first semiconductor layer having a first side and a second side opposite to each other, the second side facing the semiconductor substrate;
a second semiconductor layer of a second conductivity type, provided at a surface of the first semiconductor layer at the first side thereof, the second semiconductor layer having a first side and a second side opposite to each other, the second side of the second semiconductor layer facing the first semiconductor layer;
in the active region,
a plurality of first semiconductor regions of the first conductivity type, selectively provided in a surface layer of the second semiconductor layer at the first side thereof,
a gate insulating film having a first side and a second side opposite to each other, a surface thereof at the second side being in contact with the second semiconductor layer,
a plurality of first gate electrodes provided at a surface of the gate insulating film at the first side thereof,
an interlayer insulating film provided on the plurality of first gate electrodes,
a first first-electrode provided at a surface of the second semiconductor layer and surfaces of the plurality of first semiconductor regions, and
a first plating film selectively provided on the first first-electrode, and partially covering the first first-electrode in a depth direction of the semiconductor device;
in the gate ring region,
a first insulating film having a first side and a second side opposite to each other, a surface thereof at the second side being in contact with the second semiconductor layer, and
a second gate electrode provided at a surface of the first insulating film at the first side thereof, and
a gate wiring electrode provided on the second gate electrode;
in the ring region,
a second first-electrode provided at the surface of the second semiconductor layer and having an electric potential equal to that of the first first-electrode, and
a second plating film provided on the second first-electrode, and partially covering the second first-electrode in the depth direction of the semiconductor device; and
a second electrode provided at the back surface of the semiconductor substrate, wherein
in a plan view of the semiconductor device,
the gate wiring electrode in the gate ring region forms a closed loop to fully surround the first first-electrode in the active region, and
the second first-electrode in the ring region forms another closed loop to fully surround the gate wiring electrode in the gate ring region;
the electric potential of the second first-electrode is fixed to that of the first first-electrode via the second semiconductor layer; and
the second plating film is spaced apart from the first plating film.

* * * * *